(12) United States Patent
Pasandi et al.

(10) Patent No.: US 11,303,281 B2
(45) Date of Patent: Apr. 12, 2022

(54) EFFICIENT PIPELINED ARCHITECTURE FOR SUPERCONDUCTING SINGLE FLUX QUANTUM LOGIC CIRCUITS UTILIZING DUAL CLOCKS

(71) Applicant: UNIVERSITY OF SOUTHERN CALIFORNIA, Los Angeles, CA (US)

(72) Inventors: Ghasem Pasandi, Los Angeles, CA (US); Massoud Pedram, Beverly Hills, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 17/221,998

(22) Filed: Apr. 5, 2021

(65) Prior Publication Data

US 2022/0021391 A1    Jan. 20, 2022

Related U.S. Application Data

(60) Provisional application No. 63/004,743, filed on Apr. 3, 2020.

(51) Int. Cl.
| | | |
|---|---|---|
| *H03K 19/195* | (2006.01) | |
| *H03K 19/096* | (2006.01) | |
| *G06N 10/00* | (2019.01) | |
| *H03K 19/20* | (2006.01) | |
| *H03K 19/17736* | (2020.01) | |

(52) U.S. Cl.
CPC .......... *H03K 19/195* (2013.01); *G06N 10/00* (2019.01); *H03K 19/096* (2013.01); *H03K 19/17744* (2013.01); *H03K 19/20* (2013.01)

(58) Field of Classification Search
None
See application file for complete search history.

(56) References Cited

U.S. PATENT DOCUMENTS 10,769,344 B1 *   9/2020   Schneider ............. G06F 30/337
2017/0104491 A1 *   4/2017   Shauck ................ H03K 19/195

FOREIGN PATENT DOCUMENTS

CN        112116094 A    * 12/2020

* cited by examiner

*Primary Examiner* — Jany Richardson
(74) *Attorney, Agent, or Firm* — Brooks Kushman P.C.

(57) ABSTRACT

An SFQ circuit system includes at least one SFQ block having a plurality of SFQ logic gates. Characteristically, at least a portion of the SFQ logic gates are arranged in series. The SFQ circuit system includes a timing system configured to provide a first set of inputs and collect a first set of outputs of the at least one SFQ block at a rate defined by a slow clock frequency while the SFQ logic gates are clocked at a fast clock frequency. Advantageously, the rate is sufficiently slow to allow the first set of inputs to propagate through all levels of the SFQ logic gates to produce the first set of outputs of the at least one SFQ block without colliding with a second set of inputs to the at least one SFQ block.

31 Claims, 17 Drawing Sheets

(a)

(b)

Algorithm 1: Partial Path Balancing Given an Imbalance Bound

Input: A mapped network $N = (V,E)$,
$\lambda$: imbalance bound
Output: Partially balanced network $N_{PB}$, $E_{PB}$)
// Initializing variables used for lengths of longest / shortest paths :

1 for *each node $V_i$ in $V$* do
2     If *$V_i$ is a PI* then
3         $L_{V_i} = 0$;
4         $S_{V_i} = 0$;
5     else
6         $L_{V_i} = \text{INT\_MIN}$;
7         $S_{V_i} = \text{INT\_MAX}$;

8 Sort $V$ to be in topological order.
// Finding length of shortest / longest paths before inserting DFFs:

9 for *each node $V_i$ in $V$* do
10     if *$V_i$ is not a PI* then
11         $L_{V_i} = \max_j \{L_{V_j}\} + 1 : \forall V_j \in \text{fanins}(V_i)$;
12         $S_{V_i} = \min_j \{S_{V_j}\} + 1 : \forall V_j \in \text{fanins}(V_i)$;

// Inserting DFFS:

13 for *each node $V_i$ in $V$* do
14     $\Delta_{V_i} = L_{V_i} - S_{V_i}$;
15     if $\Delta_{V_i} > \lambda$ then
16         Insert $\Delta_{V_i} - 1$ number of DFFs onto the shortest path of $V_i$;
17         Update $L_{V_i}$ and $S_{V_i}$ for all $V_j \in \text{TFO}(V_i)$;

18
19 return $N_{PB}$;

*Fig. 15*

EFFICIENT PIPELINED ARCHITECTURE FOR SUPERCONDUCTING SINGLE FLUX QUANTUM LOGIC CIRCUITS UTILIZING DUAL CLOCKS

CROSS-REFERENCE TO RELATED APPLICATIONS

This application claims the benefit of U.S. provisional application Ser. No. 63/004,743 filed Apr. 3, 2020, the disclosure of which is hereby incorporated in its entirety by reference herein.

STATEMENT REGARDING FEDERALLY SPONSORED RESEARCH OR DEVELOPMENT

The invention was made with Government support under Contract No. W911NF-17-1-0120 awarded by the Intelligence Advanced Research Projects Activity (IARPA). The Government has certain rights to the invention.

TECHNICAL FIELD

In at least one aspect, the present invention is related to superconductor circuits and computers.

BACKGROUND

Advances in semiconductor manufacturing technology have resulted in a decades-long decrease in the minimum feature size of transistors and an increase of their switching speed [1]. However, in spite of the accompanying supply voltage scaling, power densities on chips have been increasing, resulting in a practical upper limit of 4 GHz or so for the clock frequency of processors (a limit that was achieved in mid 2000's). A related phenomenon is the dark silicon problem [2], which simply states that significant portions of a chip cannot be powered up at the same time due to power delivery and heat dissipation concerns. In addition, Moore's law is coming to an end because transistors are reaching their physical scaling limits below which classical principles that dictate their operation cease to be valid. Therefore, to keep up with the ever increasing demand for energy-efficient and high-speed electronics, new materials, devices, circuit fabrics, and architectures are needed.

Key features of Josephson junction integrated digital circuits, which make them uniquely suitable for high-speed processing of digital information, include: (i) Availability of superconducting microstrip transmission lines capable of transferring picosecond waveforms over virtually any inter-chip distances with speed approaching half of that of light, and with low attenuation and dispersion, (ii) Availability of Josephson junctions which can serve as picosecond two-terminal devices. Moreover, these junctions can be impedance-matched with the superconducting microstrip lines, ensuring the ballistic transfer of generated waveforms along lines (more precisely, information between logic devices is passed ballistically along either passive microstrip lines or active Josephson transmission lines in the form of picosecond quantized voltage pulses with a fixed magnetic flux of 2.07 mV×ps, or alternatively stated, 2.07 μA×nH), and (iii) Even at these low impedances (e.g., 10 Ohms) the Josephson junction's static power consumption $P=V^2/R$ is 400 nW at a bias voltage of 2 mV (alternatively, with a bias current of 100 μA for the junction and a bias voltage of 2 mV, the static power dissipation per junction is 200 nW). As a result, chips with Josephson junction integrated circuits generate little heat and can thus be packed very closely.

Superconducting Single Flux Quantum (SFQ) technology with a combination of fast switching (1 ps) and high energy efficiency (switching energy consumption of $10^{-19}$ J) offers a promising alternative to the Metal-Oxide Semiconductor (CMOS) technology [3]. SFQ logic is divided into ac-biased and dc-biased logic families. Adiabatic Quantum Flux Parametron (AQFP) [4] and Reciprocal Quantum Logic (RQL) [5] are two examples for ac-biased, whereas Rapid Single Flux Quantum (RSFQ) [6], Energy-efficient RSFQ (ERSFQ) [7], and energy-efficient SFQ (eSFQ) [3] are examples for dc-biased SFQ logic families.

The first version of RSFQ logic relied on having ohmic resistors for interconnection of Josephson Junctions (JJs). Later on, these resistors are replaced with JJs, resulting in improving parameter margins and increasing the operation speed from 30 GHz to 770 GHz for a T-Flip-Flop (TFF) [8-10]. For more complicated SFQ circuits, a 20 GHz asynchronous arithmetic unit [11], a 16-bit wave-pipelined sparse-tree RSFQ adder with a peak processing rate of 38.5 GHz [12], and an 8-bit ERSFQ Aligned-Front (AF) adder [13] with a tested clock frequency of up to 27 GHz are reported.

The first study on design tools of superconducting electronics (SCE) was published in 1990 [14] and the latest study on the status and roadmap of these tools is published in January 2018 [15]. C. Fourie [15] argued that significant improvements on the current best design tools in different design flow steps of superconducting electronics starting from Technology Computer-Aided Design (TCAD) and compact SPICE model extraction tools, all the way to HDL model generation tools, logic synthesizers, and simulators, and static timing analysis tools are needed. In this regard, there have been a few on-going types of research to improve the state-of-the-art tools for superconducting electronics including a depth minimization with path balancing algorithm for minimizing the depth and path balancing overhead during technology mapping [16, 17], clocking techniques for SFQ circuits [18], margin and yield calculation [19], SFQ specific placement and routing [20], and SFQ library cell design [21].

Each RSFQ logic gate in an RSFQ circuit has two or more stable flux states. The logic gate is fed by SFQ pulses which can arrive on input lines and a clock line. Each clock pulse marks a boundary between two adjacent clock periods by setting the cell into some known initial state. During a new clock period, SFQ pulses may (or may not) arrive at each of the cell inputs. The arrival of an SFQ pulse at any input line during the current clock period defines a logic value "1" for the corresponding input signal, whereas the absence of a pulse during this period defines the logic value "0" of this signal. (Input pulses can arrive in any sequence.) Each pulse may change the internal state of the cell, but it cannot produce any immediate response at the gate output. Only the clock pulse is able to generate the output pulse based on the internal state of the gate (which itself is determined by the input signal pulses which have arrived during this period). The same clock pulse defines the end of the clock period and resets the logic gate into its initial state. Thus, an elementary logic gate of the RSFQ family is equivalent to a conventional combinational logic gate coupled with a DFF storing its output value until the end of the clock period. In other words, any input pulses to a logic gate may be treated as tokens that must arrive in the same clock period and are consumed by the clock pulse that arrives at the end of the period.

According to the standard SFQ logic circuit design methodology, it is required to insert path balancing DFFs to ensure that there are the same number of clocked circuit elements in any path from a Primary Input (PI) to a Primary Output (PO) of the circuit. This is called Full Path Balancing (FPB) method. A fully path-balanced circuit generates valid logic values at its internal nodes and POs by guaranteeing the delivery of pulses at all inputs of a logic gate in the same clock cycle so that the clock pulse that arrives at the end of this cycle can read the correct output value.

If a circuit is not fully path-balanced, there will exist at least one gate in the circuit with one early input pulse (i.e., a pulse that arrives during a previous clock period). As stated above, this early input pulse will be consumed by the clock pulse at the end of the corresponding clock period and before the arrival (or not) of pulses on other inputs of the said logic gate, thereby (potentially) generating a wrong value at the gate output in the current period. For example, in FIG. 1A, OR of the first ($PI_1$) and the second ($PI_2$) inputs are supposed to be passed to the following AND gate ($g_2$) together with the third ($PI_3$) input. OR of the first and the second inputs in this example is "1", which will appear as a pulse at the output of this gate ($g_1$). However, before this pulse arrives at $g_2$, the value on $PI_3$ (which initially was a "1") is consumed in the first clock pulse by $g_2$. Therefore, the generated pulse by $g_1$ is evaluated by the second round of inputs on $PI_3$ (a "0" in this example), and causes generation of a wrong value of "0" at the output of $g_2$. The same problem shows up in regards to the fourth input pulse (value of "1" on $PI_4$). If one considers each round of inputs on $PI_1$ to $PI_5$ as a wave propagating through the circuit, then this scenario may be seen as the first round of inputs "colliding" with the second round of inputs, causing the intermediate signal values to be wrong. These wrong values will propagate through the circuit and finally create a wrong "0" at the final output of the circuit (output of the XOR gate). By inserting path balancing DFFs into this circuit (cf. FIG. 1B), there will be no early signals at input lines of any logic gate. Therefore, the circuit functions correctly, and at the fourth clock cycle, it generates a pulse representing a "1" at the output of the XOR gate.

The FPB method requires the insertion of many path balancing DFFs, which can exceed the total number of gates in the original circuit. FIG. 2 compares the path balancing DFF count with the original gate count for a few ISCAS [22] and arithmetic circuits. KSA32 is a 32-bit Kogge-Stone Adder, Mult8 is an 8-bit array multiplier, and IntDiv8 is an 8-bit integer divider. For IntDiv8, DFF count is nearly 4.5× as the gate count.

Accordingly, there is a need for improved superconductor circuits with decreased numbers of components.

SUMMARY

In at least one aspect, the present invention provides a new architecture for realizing SFQ circuits by employing fast and slow clock signals. In this new architecture, there is no need to insert any path balancing D-Flip-Flops (DFFs) to ensure the correct operation of an SFQ circuit. Considering the fact that DFF count can be very high (4.5× as the gate count in an 8-bit integer divider), this new architecture results in large savings in terms of the total JJ count and chip area. Consequently, the local clock frequency can be increased due to a shortening of the transmission lines needed to connect SFQ logic gates. However, the new architecture will degrade the peak throughput of the circuit. The degree of throughput degradation can be systematically reduced by doing partial path balancing of the circuit, resulting in a trade-off between path balancing DFF overhead and the peak throughput. Notice that due to instruction data dependencies, program branches, etc., actual (sustainable) throughput is typically a lot less than the peak throughput (of course, the amount of deviation between actual and peak throughput is application dependent). Therefore, some throughput loss is acceptable.

In another aspect, an SFQ circuit system is provided. The SFQ circuit system includes at least one SFQ block having a plurality of SFQ logic gates. Characteristically, at least a portion of the SFQ logic gates is arranged in series. The SFQ circuit system includes a timing system configured to provide a first set of inputs and collect a first set of outputs of the at least one SFQ block at a rate defined by a slow clock frequency while the SFQ logic gates are clocked at a fast clock frequency. Advantageously, the rate is sufficiently slow to allow the first set of inputs to propagate through all levels of the SFQ logic gates to produce the first set of outputs of the at least one SFQ block without colliding with a second set of inputs to the at least one SFQ block.

In another aspect, an SFQ circuit system is provided. The SFQ circuit system includes at least one SFQ block having a plurality of SFQ logic gates. Characteristically, at least a portion of the SFQ logic gates is arranged in series. The SFQ circuit system also includes a timing system configured to provide a first set of inputs and collect a first set of outputs of the at least one SFQ block at a first rate defined by a slow clock frequency (e.g., the first rate is equal to the slow clock frequency) while the SFQ logic gates are clocked at a second rate defined by a fast clock frequency (e.g., the second rate is equal to the fast clock frequency). Advantageously, the first rate is sufficiently slower than the second rate to enable the first set of inputs to be presented one or more times to the at least one SFQ block at the second rate and the first set of inputs to propagate through all levels of the SFQ logic gates to produce the first set of outputs of the at least one SFQ block without colliding with a second set of inputs to the at least one SFQ block.

In another aspect, an SFQ circuit system is provided. The SFQ circuit system includes at least one SFQ block that includes a plurality of SFQ logic gates where at least a portion of the SFQ logic gates is arranged in series. The SFQ circuit system also includes an SFQ clock generator circuit, generating two clock signals, each signal comprising a regular stream of SFQ clock pulses. The first clock signal is a fast clock signal operating at a fast clock frequency, while the second clock signal is a slow clock signal operating at a slow clock frequency. The fast clock frequency is larger than the slow clock frequency. Characteristically, the inputs to and outputs of at least one SFQ block being provided at the rate of the slow clock frequency, while the SFQ logic gates in at least one SFQ block are clocked at the rate of the fast clock frequency.

In another aspect, an SFQ circuit system is provided. The SFQ circuit system includes a plurality of SFQ blocks where each SFQ block including a plurality of SFQ logic gates, at least a portion of the SFQ logic gates arranged in series. The SFQ circuit system also includes an SFQ clock generator circuit, generating two clock signals. Each signal includes a regular stream of SFQ clock pulses, where the first clock signal is a fast clock signal operating at a fast clock frequency and the second clock signal is a slow clock signal operating at a slow clock frequency. Characteristically, the fast clock frequency is larger than the slow clock frequency. A dual clock repeat band performs input signal repetition. The dual clock repeat band includes a plurality of SFQ non-destructive read-out (NDRO) registers where each SFQ NDRO register receiving an input signal to its "set" pin, the fast clock signal on its "clk" pin, and the slow clock signal on its "reset" pin. The SFQ circuit system also includes a dual clock mask band that performs valid output collection. The dual clock mask band includes a plurality of 2-input SFQ AND gates, which operate at the fast clock frequency. Each 2-input SFQ AND gate has a signal from the slow clock as a first input and an output signal from a preceding gate as a second input. Characteristically, each SFQ block operates with the fast clock frequency and is preceded by a corresponding dual clock repeat band and succeeded by a corresponding dual clock mask band.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein:

FIG. 15: Algorithm I: Partial Path Balancing Given an Imbalance Bound.

DETAILED DESCRIPTION

Figure 1A:
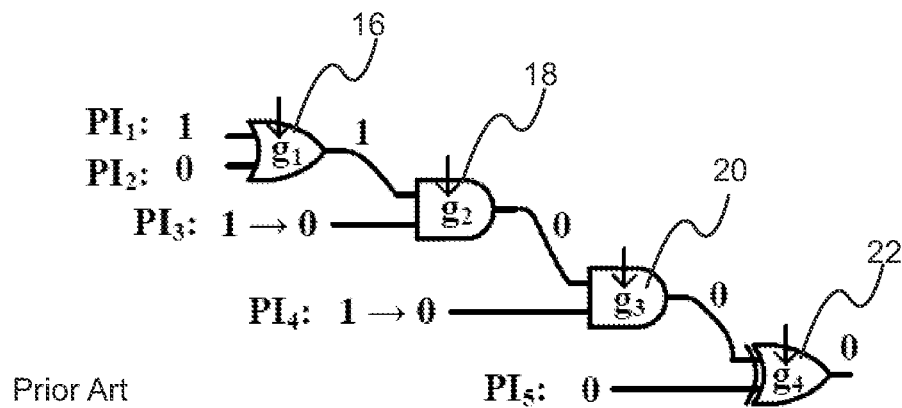
FIGS. 1A and 1B: (A) An unbalanced circuit with incorrect operation, (B) path-balanced version of this circuit with correct operation.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

For any device described herein, linear dimensions and angles can be constructed with plus or minus 50 percent of the values indicated rounded to or truncated to two significant figures of the value provided in the examples. In a refinement, linear dimensions and angles can be constructed with plus or minus 30 percent of the values indicated rounded to or truncated to two significant figures of the value provided in the examples. In another refinement, linear dimensions and angles can be constructed with plus or minus 10 percent of the values indicated rounded to or truncated to two significant figures of the value provided in the examples.

With respect to electrical devices, the term "connected to" means that the electrical components referred to as connected to are in electrical communication. In a refinement, "connected to" means that the electrical components referred to as connected to are directly wired to each other. In another refinement, "connected to" means that the electrical components communicate wirelessly or by a combination of wired and wirelessly connected components. In another refinement, "connected to" means that one or more additional electrical components are interposed between the electrical components referred to as connected to with an electrical signal from an originating component being processed (e.g., filtered, amplified, modulated, rectified, attenuated, summed, subtracted, etc.) before being received to the component connected thereto.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term "electrical signal" refers to the electrical output from an electronic device or the electrical input to an electronic device. The electrical signal is characterized by voltage and/or current. The electrical signal can be stationary with respect to time (e.g., a DC signal) or it can vary with respect to time.

The terms "DC signal" refer to electrical signals that do not materially vary with time over a predefined time interval. In this regard, the signal is DC over the predefined interval. "DC signal" includes DC outputs from electrical devices and DC inputs to devices.

The terms "AC signal" refer to electrical signals that vary with time over the predefined time interval set forth above for the DC signal. In this regard, the signal is AC over the predefined interval. "AC signal" includes AC outputs from electrical devices and AC inputs to devices.

It should also be appreciated that any given signal that has a non-zero average value for voltage or current includes a DC signal (that may have been or is combined with an AC signal). Therefore, for such a signal, the term "DC" refers to the component not varying with time and the term "AC" refers to the time-varying component. Appropriate filtering can be used to recover the AC signal or the DC signal.

The term "electronic component" refers is any physical entity in an electronic device or system used to affect electron states, electron flow, or the electric fields associated with the electrons. Examples of electronic components include, but are not limited to, capacitors, inductors, resistors, thyristors, diodes, transistors, etc. Electronic components can be passive or active.

The term "electronic device" or "system" refers to a physical entity formed from one or more electronic components to perform a predetermined function on an electrical signal.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

Throughout this application, where publications are referenced, the disclosures of these publications in their entireties are hereby incorporated by reference into this application to more fully describe the state of the art to which this invention pertains.

Abbreviations

"DDF" means D flip-flop.
"DRO" means destructive readout.
"FPB" means Full Path Balancing.
"JJ" means Josephson junction.
"NDRO" means non-destructive read-out.
"NPB" means No Path Balancing.

"PI" means Primary Input.
"PO" means Primary Output.
"PPB" means Partial Path Balancing.
"RSFQ" means Rapid Single Flux Quantum.
"SFQ" means Single Flux Quantum.
"TCAD" means Technology Computer-Aided Design.

In general, the SFQ circuit systems provided herein include at least one SFQ block having a plurality of SFQ logic gates. Characteristically, at least a portion of the SFQ logic gates are arranged in series. The SFQ circuit system includes a timing system configured to provide a first set of inputs and collect the first set of outputs of at least one SFQ block at a rate defined by a slow clock frequency while the SFQ logic gates are clocked at a fast clock frequency. Advantageously, the rate is sufficiently slow to allow the first set of inputs to propagate through all levels of the SFQ logic gates to produce the first set of outputs of the at least one SFQ block without colliding with a second set of inputs to the at least one SFQ block.

Figure 3A:
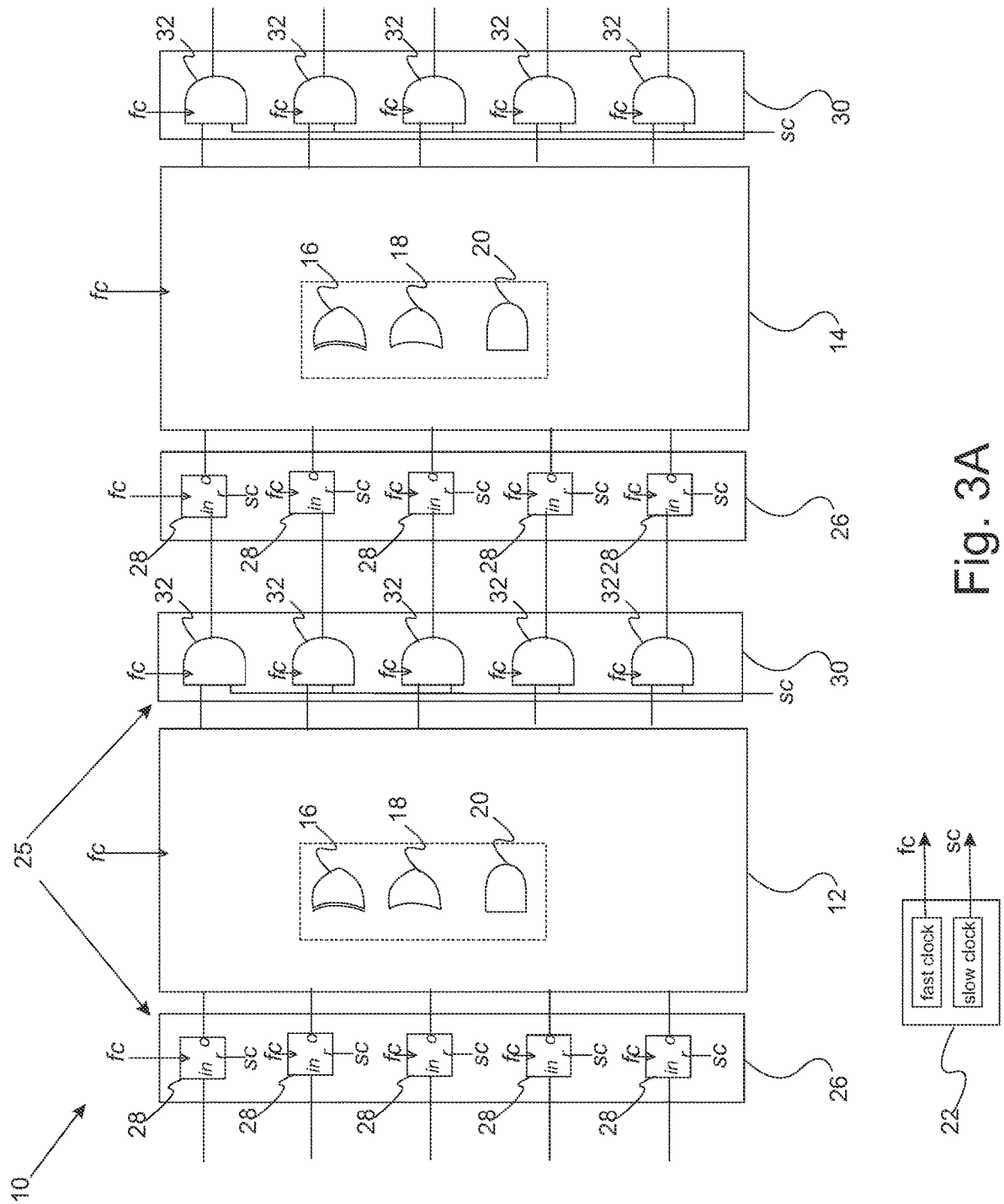
FIG. 3A: Schematic of a SFQ circuit system without feedthrough wires.
Figure 3B:
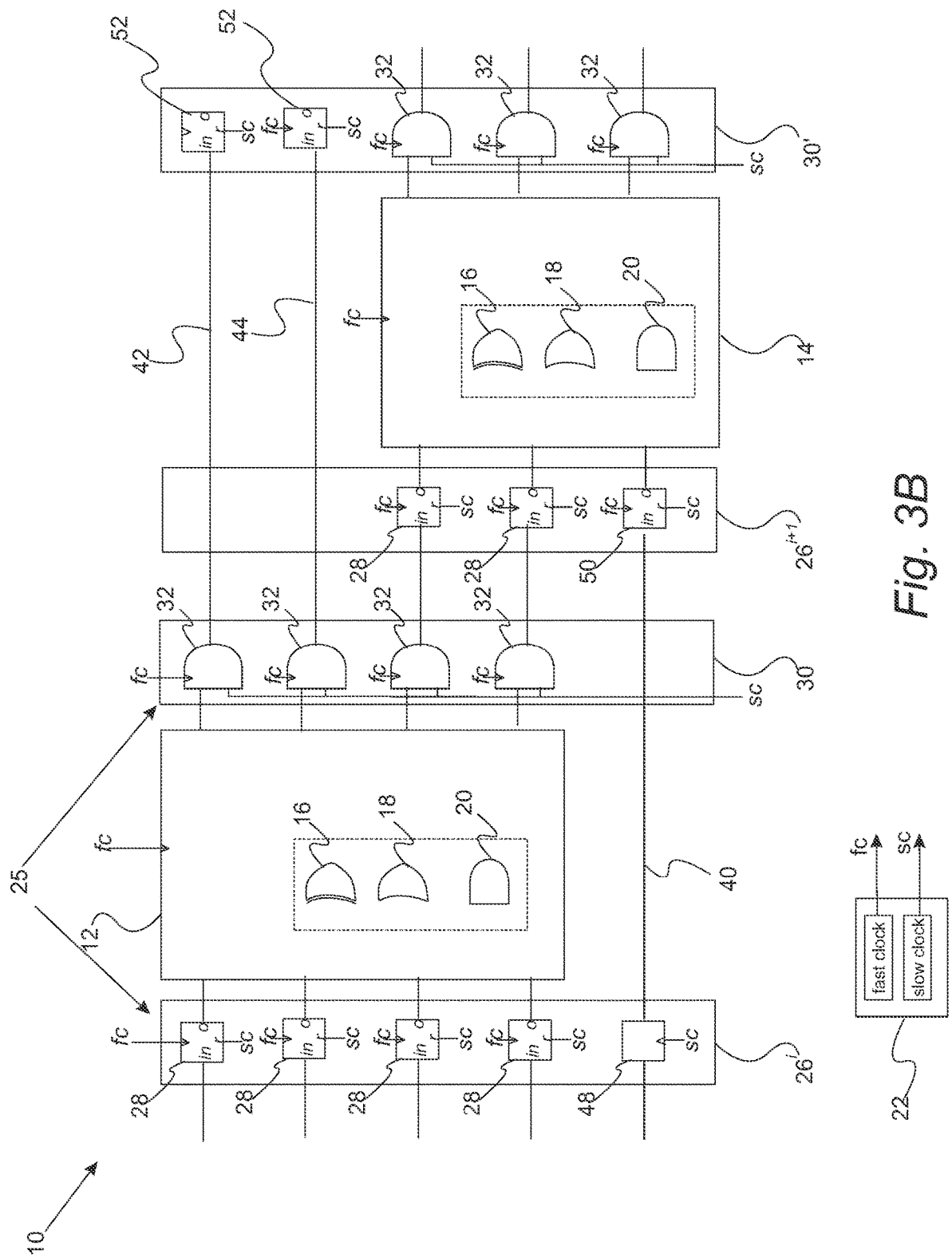
FIG. 3B: Schematic of a SFQ circuit system with feedthrough wires.

With reference to FIGS. 3A and 3B, an SFQ circuit system is schematically illustrated. SFQ circuit system 10 includes a plurality of SFQ blocks 12 and 14. Although FIG. 3B only shows two blocks, it is understood the virtually any number of blocks can be included in series or parallel. Each SFQ block includes a plurality of SFQ logic gates which are generally depicted by item numbers 16-20. The specific arrangement of the logic gates will depend on the type of circuit being defined. Typically, at least a portion of the SFQ logic gates is arranged in series. SFQ clock generator circuit 22 generates a first clock signal and a second clock signal. Each clock signal includes a regular stream of SFQ clock pulses. The first clock signal is at a fast clock signal (fc) operating at the fast clock frequency, and the second clock signal is a slow clock signal (sc) operating at the slow clock frequency. Characteristically, the fast clock frequency is larger than the slow clock frequency. As described below in more detail, inputs to and outputs of at least one SFQ block are provided at a first rate defined by the slow clock frequency, while the SFQ logic gates in the at least one SFQ block being clocked at a second rate defined by the fast clock frequency.

System 10 includes timing system 25 that includes a dual clock repeat band 26 and dual clocked mask band 30. Dual clock repeat band 26 performs input signal repetition. Dual clock repeat band 26 including a plurality of non-destructive read-out registers 28, each non-destructive read-out register 28 receives an input signal on its set pin, the fast clock signal (fc) on its "clk" pin, and the slow clock signal (sc) on its "reset" pin. The fast clock operates at a fast clock frequency, and the slow clock operates at a slow clock frequency. It should be appreciated that the SFQ blocks are operated with the fast clock. SFQ circuit system 10 which includes dual clocked mask band 30 performs output validation collection. Dual clocked mask band 30 includes a plurality of 2-input AND gates 32 which operate at the fast clock frequency. Each 2-input AND gate has a signal from the slow clock as a first input and an output signal from a preceding gate as a second input. Mask band 30 prevents the propagation of invalid values to the succeeding logic block until such time that valid values are generated and can be passed onto the next block. Characteristically, each SFQ block operates with the fast clock frequency and is preceded by a corresponding dual clock repeat band and succeeded by a corresponding dual clock mask band.

The operation of SFQ circuit system 10 can be described as follows. Timing system 25 is configured to provide a first set of inputs and collect a first set of outputs of the at least one SFQ block at a first rate defined by a slow clock frequency while the SFQ logic gates are clocked at a second rate defined by a fast clock frequency wherein the first rate is sufficiently slower than the second rate to enable the first set of inputs to be presented one or more times to the at least one SFQ block at the second rate and the first set of inputs to propagate through all levels of the SFQ logic gates to produce the first set of outputs of the at least one SFQ block without colliding with a second set of inputs to the at least one SFQ block. In a refinement, the ratio of the second rate to the first rate is lower bounded by the maximum difference of path lengths from primary inputs of the at least one SFQ block to input pins of any SFQ logic gate in the at least one SFQ block. In another refinement, the ratio of the second rate to the first rate is equal to either $\lambda+1$ or $\lambda+2$ where $\lambda$ denotes the maximum difference of path lengths from primary inputs of the at least one SFQ block to input pins of any SFQ logic gate in the at least one SFQ block. In still another refinement, if a SFQ block has a logic depth D, then inputs to this SFQ block should be presented D+2 times the fast clock frequency rate in order to guarantee the generation of valid values at all of its outputs at a slow clock frequency rate, i.e., before arrival of a next pulse on the slow clock. Therefore, the slow clock frequency is about 1/(D+2) of that of the fast clock frequency. If SFQ circuit system 10 includes multiple SFQ blocks, D will be the maximum of logic depths of these SFQ blocks. It should be appreciated that when there are two or more SFQ blocks in the SFQ circuit system, D is the maximum of logic depths of these SFQ blocks.

FIG. 3B depicts a circuit system also having feedforward wires 40, 42, 44 with no clocked elements connected to them. Feedforward wires can be primary inputs or inputs from a previous SFQ block.

In a refinement, when an $i^{th}$ SFQ block has feedforward input wire that connects an output of SFQ block i−1 to an input of SFQ block i+1, the dual clock repeat band $26^i$ of block i has a corresponding destructive read-out (DRO) register (e.g, DRO DFF 48) operating at the slow clock frequency in its repeat band and receiving input signals on its data pin. In a refinement, the dual clock mask band of the $i^{th}$ SFQ block is simply a wire connection. In a further refinement, when a $j^{th}$ SFQ block has a feedforward input wire from a primary input, the jth SFQ block has an NDRO register(s) (e.g., NDRO DFF 50) in its repeat band $26^{i+1}$. In still a further refinement, when an output y of a SFQ block j is fed forward directly (after it went through the mask band of this block) as a primary output of another circuit, destructive read-out (DRO) registers (e.g., DRO DFFs 52) are inserted in mask bands 30 of SFQ blocks j+1, . . . , N where N is the number of SFQ blocks.

In one variation, the SFQ blocks are fully balanced. In another variation, the SFQ circuit system includes partially balanced SFQ blocks. Typically, the partially balanced SFQ blocks include path balancing DFFs.

Figure 8:
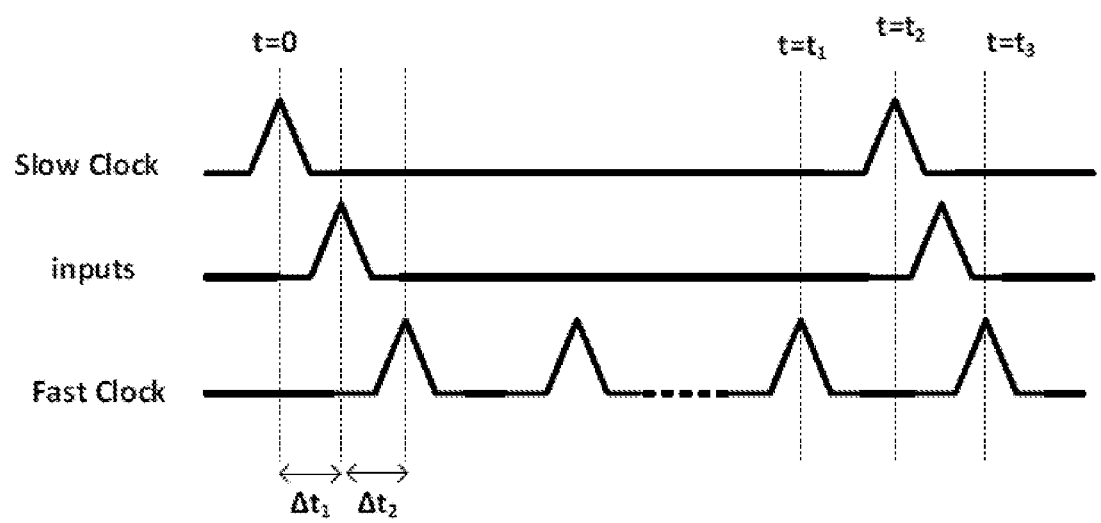
FIG. 8: Waveforms expressing timing requirements for correct operation of DCM.

In a variation, the pulse from the fast clock signal and the slow clock signal comply with time requirements as follows (see, FIG. 4B):

1. $\Delta t_1 \geq$ the intrinsic reset delay of an NDRO.
2. $\Delta t_2 \geq$ the setup time of an NDRO.
3. $\Delta t_1 + \Delta t_2 \leq T_{FastClock}$.
4. $T_{FastClock} = T_{SlowClock}/(\lambda+1)$.

wherein $\lambda$ is the maximum of imbalance factors for any SFQ blocks of the SFQ circuit system where the imbalance factor of a SFQ block is the maximum difference of path lengths from inputs of the block to input pins of any SFQ logic gate in the block; $T_{FastClock}$ is the time period for the fast clock;

$T_{SlowClock}$ is the time period for the slow clock; $\Delta t_1$ is the time offset from the slow clock to the input; and $\Delta t_2$ is the time offset from the inputs to the fast clock. In a refinement, $\lambda$ is chosen to be smaller than the maximum of logic depths of all SFQ blocks. FIG. 8 illustrates a timing sequence for the present invention. The timing requirement is described below in more details Additional details of the embodiments and variations of the present invention are set forth below and in G. Pasandi and M. Pedram, "*An Efficient Pipelined Architecture for Superconducting Single Flux Quantum Logic Circuits Utilizing Dual Clocks*," in IEEE Transactions on Applied Superconductivity, vol. 30, no. 2, pp. 1-12, March 2020, Art no. 1300412, doi: 10.1109/TASC.2019.2955095 and the published supplemental information for this publication; the entire disclosures of this publication and its supplemental information are hereby incorporated by references in their entirety.

A. No Path Balancing (NPB)

SQF circuits set forth above allow correct circuit operation without the need for path balancing DFFs.

Figure 1B:
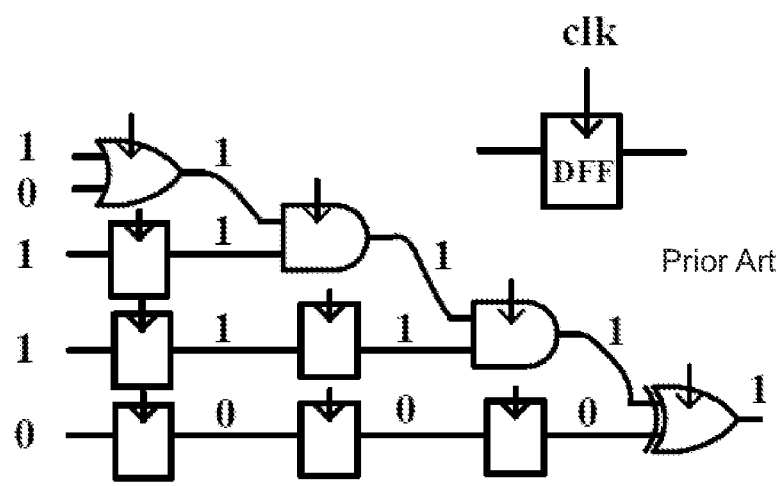
Figure 2:
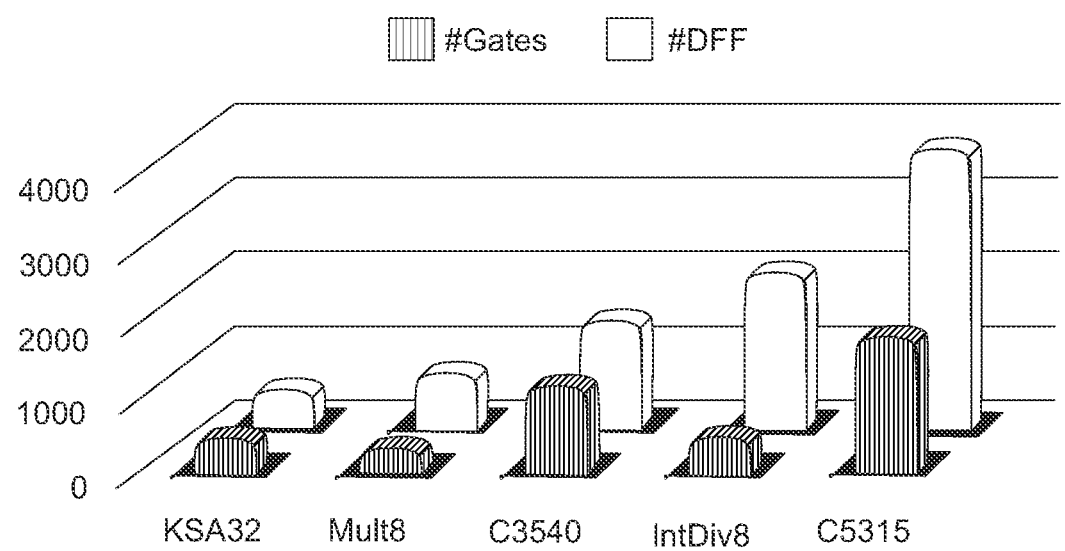
FIG. 2: Comparing the required number of path balancing DFFs to the original gate count for a few benchmark circuits when the FPB method is employed.

1) Fast/Slow Clocks and Logic Bands: An observation is that to avoid insertion of any path balancing DFF, inputs of the circuit should be presented c times where c is related to the logical depth of the circuit. This way, correct values will be generated at outputs of the circuit periodically. For example, consider $g_1$ and $g_2$ gates in FIG. 1. If values on $PI_1$, $PI_2$, and $PI_3$ are repeated once (having two copies for each data value), when the correct value is generated at the output of $g_1$ (at the arrival of the first clock pulse), it will be passed to $g_2$ together with the second copy of a valid value on $PI_3$. This will generate a valid value of "1" at the output of $g_2$ at the arrival of the second clock pulse. Similarly, if values on $PI_1$-to-$PI_4$ are repeated twice (resulting in three copies of each data value), correct values at the output of $g_3$ gate will also be generated at the arrival of the third clock pulse. Finally, if all inputs are repeated three times, every fourth clock pulse, a valid value will be generated at the output of the XOR gate.

Figure 4A:
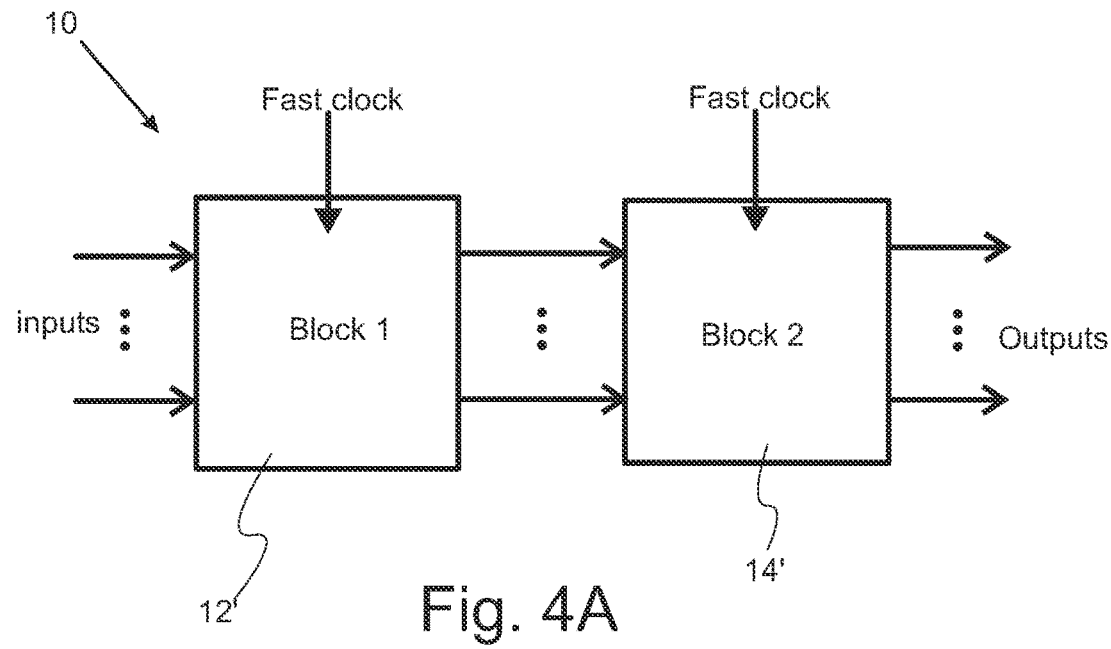
FIGS. 4A and 4B: (A) A (linear) pipeline architecture for SFQ circuits in which each block is fully path-balanced, (B) The new architecture employing a fast and a slow clock signals together with repeat (hatch line) and mask (hatch grid) bands. In the new architecture, original circuit blocks are either partially path-balanced or they are not path-balanced at all. Frequency of the slow clock is at most D+2 times lower than that of the fast clock, where $D=\max(D_1, D_2)$.

Consider a circuit partitioned into a set of computational blocks, where outputs of one block feed directly to the inputs of the next block according to some linear ordering of these blocks (FIG. 4A). It is crucial to design the said circuit blocks such that each receives its inputs and produces correct outputs at the right times. In other words, having all inputs of a block received at time t, it produces its correct outputs at the right time (at $t_{tgt}$>t, see discussions below for learning what should $t_{tgt}$ be) and prevents propagation of "garbage" values to the next circuit block at times $t'<t_{tgt}$. Evidently, if this garbage collection at the output of the current logic block is not performed, invalid pulses will be injected into the inputs of the next logic block, which will eventually cause errors at the circuit outputs.

Figure 4B:
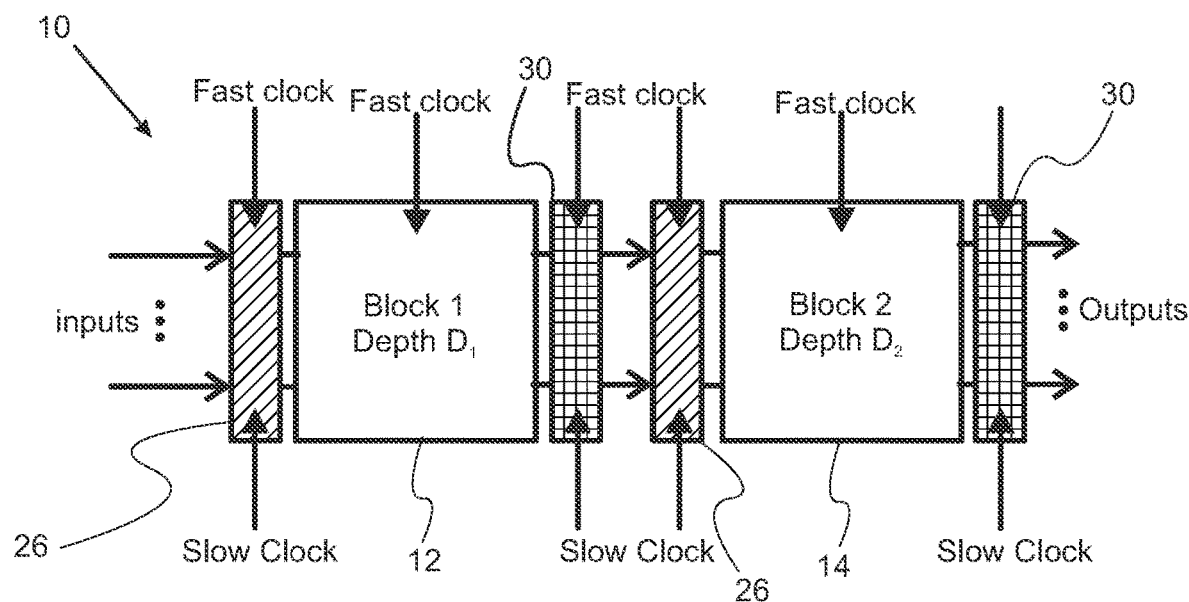
Figure 5A:
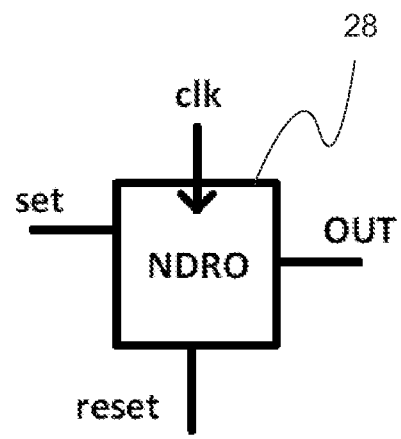
FIGS. 5A and 5B: (A) Block diagram of an NDRO, (B) its state transition diagram.
Figure 5B:
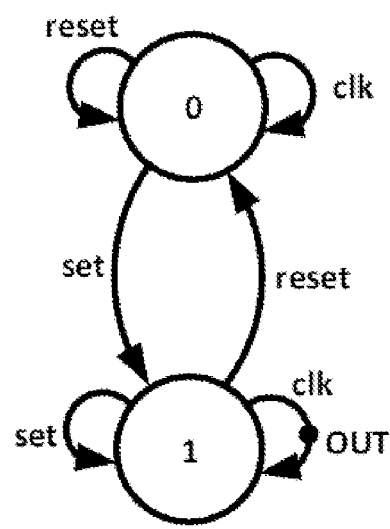

Input repetition and valid output collection for each block in the architecture for realization of SFQ circuits using two different clock pulse streams (one fast, the other slow) and (guard) bands (fences) around each block are utilized. More precisely, given a standard pipelined SFQ circuit as in FIG. 4A, in which SFQ circuit system 10' includes SFQ blocks 12' and 14', a repeat band and a mask band can be used to avoid propagation of incorrect data. In particular, SFQ circuit system 10' includes repeat band 26 at the input of each block and mask band 31 at the output of each block are shown in FIG. 4B. The design of the system of FIG. 4B is of the general design of FIG. 3A. Both repeat and mask bands receive a fast clock and a slow clock signal. In the repeat band, a non-destructive read-out register (NDRO) 26 is used on the path of each arriving input to repeat their values (see, FIG. 3A). FIG. 5 shows a block diagram of an NDRO and its state transition diagram. To write a "1" into this NDRO, a pulse should be applied to its "set" pin before the clock pulse that does the reading. To write a "0" into this NDRO, a pulse should be applied to its "reset" pin before the said clock pulse. Each NDRO in a repeat band receives a fast clock on its "clk" pin, and a slow clock on its "reset" pin. Note that inputs of the circuit block (which may be PI's or outputs of a previous circuit block) are connected to the "set" pins of these NDROs.

Inside a mask band, there are 2-input AND gates, which operate at the speed of the fast clock and have the slow clock as one of their inputs. The other input of these gates come from the preceding circuit block (e.g., Block 1 in FIG. 4B). A mask band prevents propagation of invalid values to the succeeding logic block until such time that valid values are generated and can be passed onto the next block. Recall that in each cycle of the fast clock, a value (presence or absence of a pulse) will be generated at each output of the first circuit block. However, only the last generated value is valid and should be allowed to propagate to the second logic block.

If the depth of an original block (e.g., Block 1 in FIG. 4B) is D, then the inputs to this block should be presented at most D+1 times in order to guarantee generation of a valid value at all of its outputs before the arrival of the next pulse on the slow clock. This can be achieved if we set the frequency of the slow clock to be at least 1/(D+2) of that of the fast clock. When there are two or more logic blocks in the system, D will be the maximum of logic depths of these blocks. Subject to some timing constraints, the factor of D+2 may be reduced to a factor of D.

2) Feedforward Wires: In the architecture shown in FIG. 4B, there may be some wires with no clocked elements connected to them in the first circuit block. These wires are primary inputs of the circuit that are not used in the first block but must be fed to the second circuit block. Similarly, there may be some wires with no clocked elements connected to them in the second circuit block. These wires are primary outputs of the circuit that are generated by the first block and simply pass through the second block. Let's call these types of wires feedforward wires.

In a multi-block architecture similar to FIG. 4B with N circuit blocks, suppose that a feedforward input wire exists in the $i^{th}$ block (i.e., one that goes directly from an output of circuit block i−1 to an input of circuit block i+1) (see, FIG. 3B). In this case, there is no need to repeat the value on this wire as it goes through circuit block i, i.e., there is no need to use an NDRO for this input in the corresponding repeat band of the $i^{th}$ block. Moreover, there is no need for a garbage-collecting AND gate for this wire in the corresponding mask band of the $i^{th}$ block because there is no generation of repeated pulses on this wire. However, to ensure arrival of all pulses at the input lines of circuit block i+1 in the same period of the slow clock, we must insert a DRO DFF in the repeat (or mask) band of circuit block i. This DRO DFF operates at the slow clock. As an interesting special case, consider a circuit primary input x that is fed forward directly to the circuit block at level j and used there. In this case, we insert DRO DFFs in the repeat bands of circuit blocks 1, j−1 but an NDRO DFF in the repeat band of circuit block j. As another interesting case, consider an output y of circuit block j is fed forward directly as a primary output of the circuit. In this case, we use a garbage collecting AND gate in the mask band of circuit block j but insert DRO DFFs in the repeat bands of circuit blocks j+1, . . . , N. Notice, however, that feedforward wires may not be used in the very last block of multi-block linear pipeline architecture because then the outputs of the feedforward wires will appear one fast clock cycle ahead of the other outputs of the block.

To summarize, using slow and fast clocks, one can design a pipeline architecture for SFQ circuits, whereby the circuit is decomposed as a set of logic blocks, each operating at a fast clock frequency without using any internal path balancing DFFs. We refer to this as No Path Balancing or NPB. However, the circuit is still fully path-balanced with respect to the slow clock and uses a combination of NDRO and DRO DFFs and AND gates to ensure correct circuit operation.

B. Partial Path Balancing (PPB)

Figure 6:
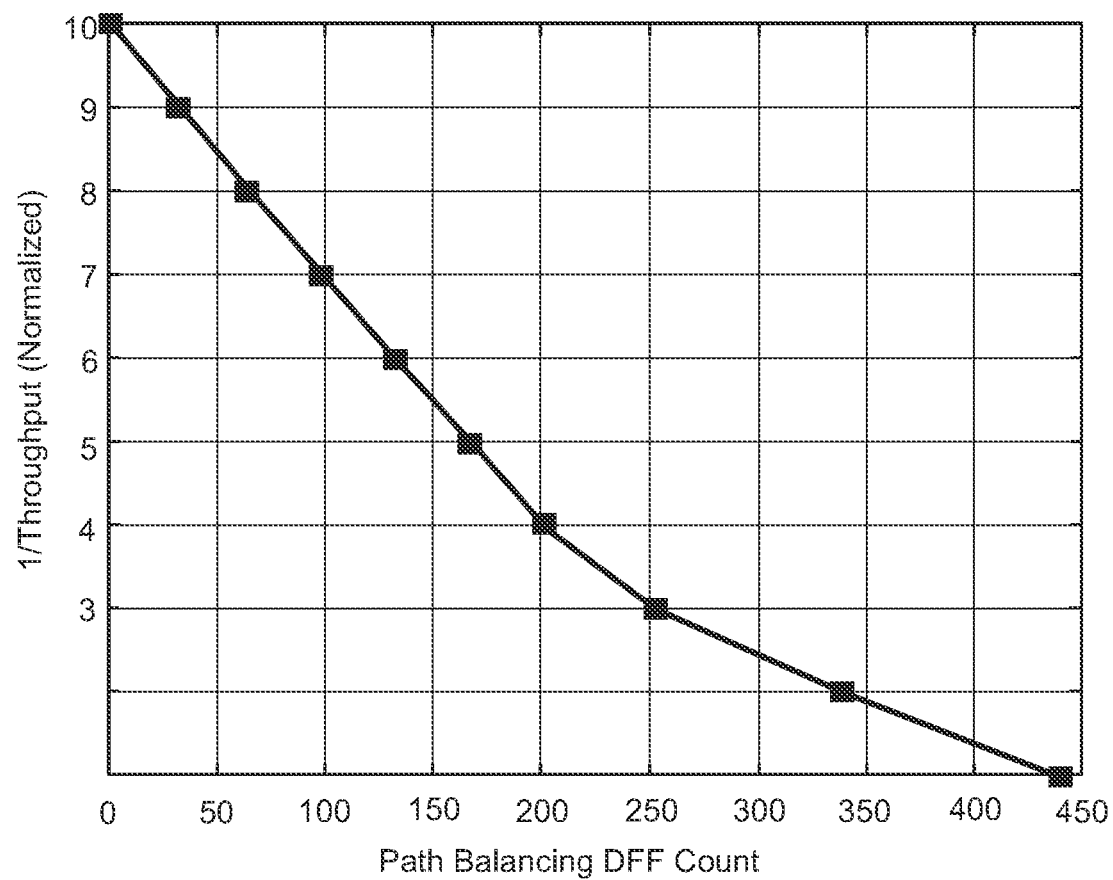
FIG. 6: Inverse of normalized throughput versus path balancing DFF count for the KSA32 circuit.

As explained in the previous subsection, the NPB method degrades the peak throughput of a circuit at most by a factor of D+2, where D is the maximum logic depth of all individual logic blocks in the circuit. Subject to some timing constraints, the D+2 degradation factor is reduced to D (see, Timing Requirements of DCM set forth below). This throughput loss may not be acceptable in some applications. So in the following a graceful throughput degradation scheme is presented, in which it is possible to control throughput loss by partially balancing logic blocks of the circuit. In fact, inverse of the throughput and the path balancing DFF overhead for a circuit block exhibits the relationship shown in FIG. 6. Therefore, if a higher peak throughput is desired, some path balancing DFFs can be inserted into the logic blocks [starting with the one that had the maximum imbalance factor (see below) among all circuit blocks].

The imbalance factor for a logic gate in a given circuit is the maximum difference between logic levels of its fan in gates (Logic level of a gate $g_i$ in a network N is the length of the longest path in terms of the gate count from any primary input of N to $g_i$). The imbalance factor for a single-output circuit may be defined as the maximum imbalance factor of any gate in the circuit. For a multi-output circuit, one may add a dummy node and connect outputs of the original circuit to this dummy node, thereby producing a single-output circuit. In this way, the imbalance factor for a multi-output circuit can easily be calculated. Evidently, for a circuit of depth D, the imbalance factor ranges from 0 to D [note that an imbalance factor of D implies a circuit with at least two outputs, one with a logic depth of D and the other with a logic depth of 0 (a feed forward wire)].

Figure 7A:
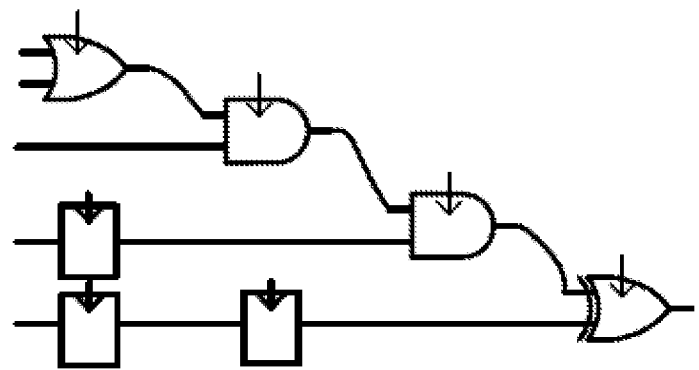
FIGS. 7A and 7B: Partial path balancing of the circuit shown in FIG. 1 with (A) $\lambda=1$, (B) $\lambda=2$
Figure 7B:
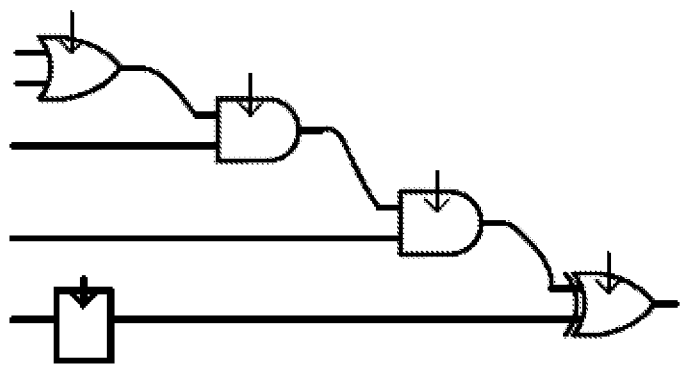

In partially path-balanced circuits, one makes sure that the imbalance factor of the circuit is upper bounded by an integer value $\lambda$, called the imbalance bound. If the imbalance factor of the circuit is greater than $\lambda$, then path balancing DFFs must be inserted to the circuit to meet the partial path balancing requirement as explained below. A simple heuristic for doing the said partial path balancing as follows is devised. The circuit nodes are traversed in topological order from circuit inputs toward circuit outputs. If the length of the longest and shortest paths from any PI to any traversed node $v_i$ are $L_{v_i}$ and $S_{v_i}$, and $\Delta_{v_i} = L_{v_i} - S_{v_i} > \lambda$, then $\Delta_{v_i} - \lambda$ path balancing DFFs will be inserted onto the shortest path. Partially path-balanced versions of the circuit in FIG. 1A with $\lambda=1$, and $\lambda=2$ are shown in FIG. 7A, and FIG. 7B, respectively.

The peak throughput of a partially path-balanced logic block for a given $\lambda$ will be $$\frac{1}{\lambda+1}$$

times that of the fully path-balanced version of the block. Therefore, by adjusting $\lambda$, one can control degradation in the peak throughput. In the extreme case of $\lambda=0$, the circuit block is fully path-balanced and the repeat and mask bands are unnecessary. In the other extreme of $\lambda=D$ (or $\lambda=D-1$ for a single-output circuit), the circuit block is not path-balanced at all, and the peak throughput loss is simply $1/(\lambda+1)$. For example, in KSA32 circuit, the NPB method decreases the peak throughput by a factor of 12, while the gate and DFF count is decreased from 998 (for a fully path-balanced and retimed circuit) to 596. Based on FIG. 6, the PPB method limits the peak throughput degradation to a factor of four by inserting 200 path balancing DFFs, increasing the gate and DFF count to 894.

Figure 16:
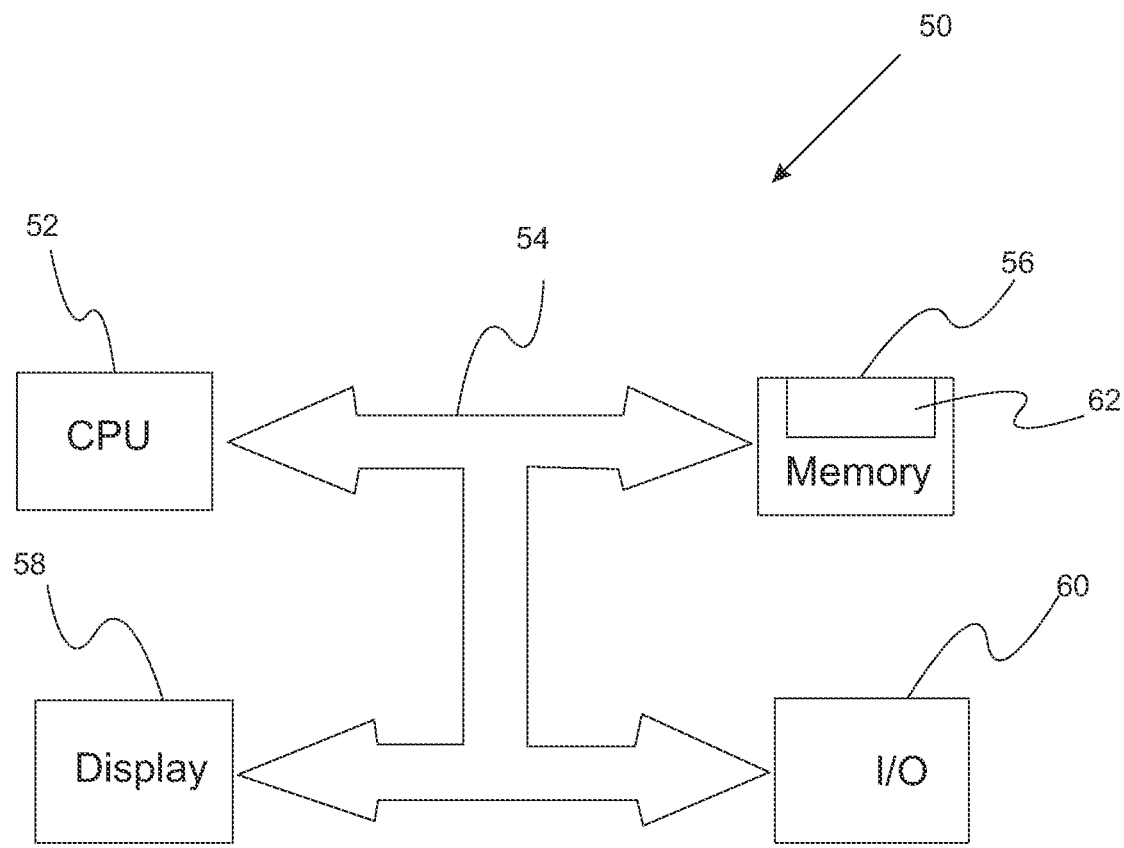
FIG. 16: Algorithm for executing Algorithm I of FIG. 15.

Algorithm 1 (see FIG. 15) shows the pseudo code for partially path balancing a mapped circuit. After initializing the variables in lines 1-7, nodes are sorted to be in a topological order in line 8. The topological sorting is to ensure that in the next two f or loops, whenever a node is visited, its children had already been visited. Next, in lines 9-12, the length of the longest and shortest paths from any PI to a node in the given network is found. In lines 13-16, partial path balancing DFFs are inserted into the shortest path which does not satisfy the said requirement for a given partial balancing bound $\lambda$. In line 17, length of the longest and shortest paths for all nodes in the Transitive Fanout Cone (TFO) of node $V_i$ are updated (In a network N=(V,E), which is modeled by a DAG, TFO($V_i$) is a set of nodes in V which are reachable from $V_i$ by traversing only on the direction of edges). The steps of algorithm 1 can be encoded in a non-transitory storage medium and executed by a computer system 50 depicted in FIG. 16. Computer system 50 includes a central processing unit 52 in communication via bus 54 with memory 56, display 58, and input/output interface 60. Memory 56 includes memory such as random access memory and the non-transitory storage medium 62.

Since both PPB and NPB methods use slow and fast clocks, from here on, we call them Dual Clocking Methods (DCMs).

C. Timing Requirements of DCM

Let $\lambda$ denote the maximum of imbalance factors for any logic blocks of the circuit. In the following discussion, let's assume the first logic block is responsible for setting the maximum imbalance factor (see below for the case where some other logic block is responsible for setting the maximum imbalance factor).

To make sure that the architecture in FIG. 4B works correctly, some timing requirements must be met, which are listed below (see FIG. 8):

1. $\Delta t_1 \geq$ the intrinsic reset delay of an NDRO.
2. $\Delta t_2 \geq$ the setup time of an NDRO.
3. $\Delta t_1 + \Delta t_2 \leq T_{FastClock}$.
4. $T_{FastClock} = T_{SlowClock}/(\lambda+1)$.

The first requirement ensures that inputs are applied to the "set" pin of NDROs after the reset operation is done. The second requirement is a simple statement of setup time constraint for NDROs in the repeat bands.

The third requirement is to ensure that the valid value will not be lost by late or early arrival of the second input of a masking AND gate, i.e., $t_1 \leq t_2 \leq t_3$ as shown next. Valid outputs of the current block (e.g., Block 1 in FIG. 4B) are generated between two pulses of the fast clock at $t_1$ and $t_3$. To ensure that masking AND gates process these valid outputs correctly, pulses on the Slow Clock should arrive at the second input of these AND gates before $t_3$. Otherwise, the only set of guaranteed valid values on these outputs will be consumed and will not have a chance to enter the repeat band of the next block (e.g., Block 2).

Let $T=T_{SlowClock}$. Based on FIG. 8, we have:

$$t_1 = \Delta t_1 + \Delta t_2 + \frac{\lambda}{\lambda+1}T$$

The third term in the above equation comes from the fact that the period of the slow clock is $\lambda+1$ times that of the fast clock and that $t_1$ denotes the time at which the last pulse of the fast clock within a window of T occurs. According to FIG. 8:

$$t_2 = T$$
$$t_3 = t_1 + \frac{1}{\lambda+1}T = \Delta t_1 + \Delta t_2 + T$$

Because of $t_1 \le t_2 \le t_3$, we can write:

$$\Delta t_1 + \Delta t_2 + \frac{\lambda}{\lambda+1}T \le T \le \Delta t_1 + \Delta t_2 + T$$

which leads to the following inequality:

$$\Delta t_1 + \Delta t_2 \le \frac{1}{\lambda+1}T \quad (1)$$

For example, if the maximum imbalance factor among all blocks is $\lambda=2$, and $\lambda t_1=\lambda t_2=2.5$ ps, then the period of the slow clock must satisfy the following inequality: T>15 ps. Using the terminology presented in this subsection, $t_{tgt}$ which is mentioned above, should satisfy the following inequalities: $t_1 \le t_{tgt} \le t_3$.

It is important to ensure that the last correct output pulse (within a window of T) of a block is generated in less than t" seconds after pulses of the slow clock for this stage arrive, where $t"<T_{FastClock}$. In other words, a valid output pulse of a block and pulse of the slow clock going to the masking band and repeat band following this block should come in between two consecutive pulses of the fast clock. If this does hold true, with similar explanations as given for the third requirement above, the only correct value on a single output pin of this block cannot successfully pass the AND gate in its following mask band. To ensure this property, slow clock signals of mask band and repeat band following this block may be delayed.

Example 1: Suppose that depth of a block in stage one of a circuit with an architecture of FIG. 4B is four. Thus, the maximum logic level among outputs of this block will be five, because the preceding repeat band adds one to the maximum logic level. Therefore, after the fifth fast clock pulse arrives, correct values at outputs of this block are ready. Now, if $\lambda=4$, these correct values will successfully go through the corresponding masking AND gates. However, if $\lambda=3$, while the correct outputs are generated at arrival of $5^{th}$, $9^{th}$, $13^{th}$, . . . , fast clock pulses, pulses of the slow clock come at the arrival of $4^{th}$, $8^{th}$, $12^{th}$, . . . , fast clock pulses. Therefore, the correct output values cannot pass the masking AND gates. To solve this issue, the slow clock signals going to mask band and repeat band following this block should be delayed by one cycle of the fast clock.

In general, if $D_{max}$ is the maximum logic level of outputs of a block in a circuit with an architecture as of FIG. 4B, the slow clock signals in the mask band and repeat band following this block should be delayed by $(D_{max}\%(\lambda+1))\times T_{FastClock}$, where % is the modulo operation. For delaying a slow clock signal by r multiples of the fast clock cycle, it should be passed through r series DRO DFFs operating with the fast clock. In the above example, where $D_{max}=5$, and $\lambda=3$, the slow clock of the following mask band and repeat band was delayed by $1\times T_{FastClock}$ by passing through a single DRO DFF.

Note that when satisfying the above requirements is difficult to achieve for a design or we do not want to insert extra DFFs for delaying clock signals of some mask and repeat bands, then another solution is to asynchronously delay the slow clock signals of these bands to meet the requirements.

Figure 9A:
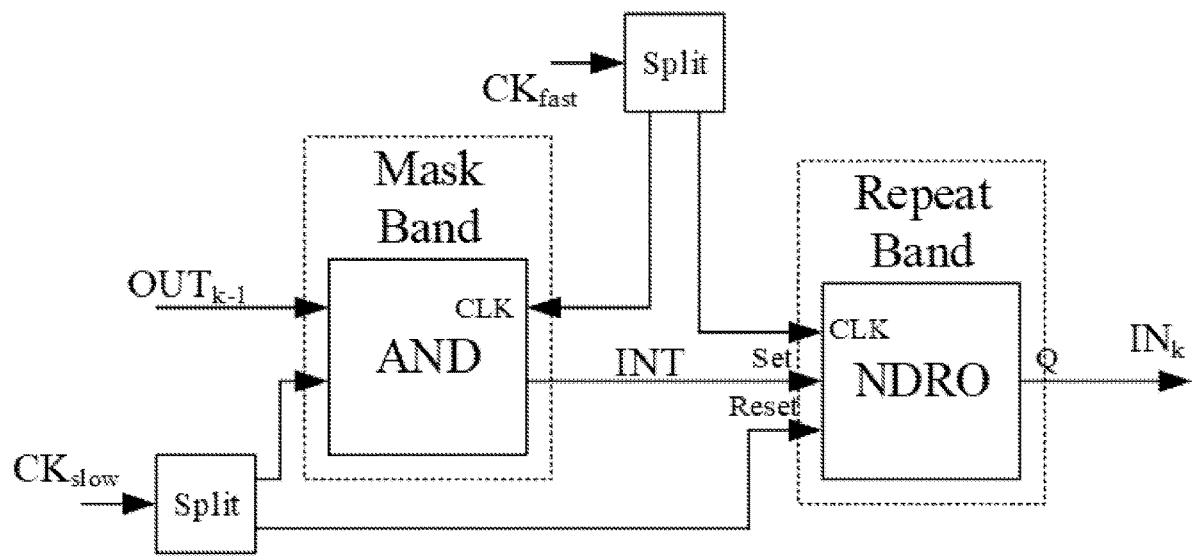
FIGS. 9A and 9B: (A) Concatenation of the mask band of logic block k−1 and repeat band of logic block k, and (b) Timing diagrams for the various clock and signal pulses corresponding to the case $\lambda=1$ and TSlow clock= $(\lambda+2)T_{Fast\ Clock}=3_{Fast\ Clock}$.
Figure 9B:
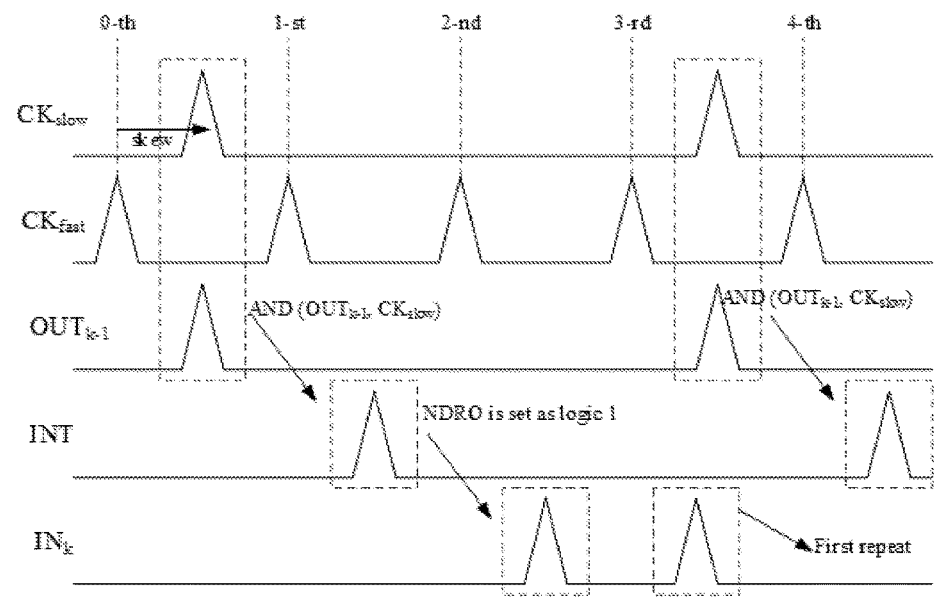

Let's now consider the case where an intermediate logic block (e.g., the second or third block in a multi-block linear pipeline architecture) is responsible for setting the maximum imbalance factor. In this case, we must impose $T_{Fast\;Clock}=TSlow\;Clock=(\lambda+2)$ to ensure the correct operation of the full linear pipeline. This is because there is a skew between the slow clock pulses and the corresponding fast clock pulses (skew is measured as the time difference between the instance at which the peak of the slow clock pulse occurs and the instance at which the peak of the last preceding fast clock pulse occurs). This skew causes the intermediate result (which is the output of the mask band of block k–1 and the input of the repeat band of block k) to be delayed by an additional fast clock cycle, causing the ratio of TSlow Clock to TFast Clock to increase from $\lambda+1$ to $\lambda+2$. (See FIG. 9).

D. Adder Design

Adders are important datapath blocks that are prevalent in all kinds of processing circuitry. We dedicate this subsection to adder design using the proposed DCM.

1) Node Count Analysis: Suppose that we want to create an n-bit adder using m smaller k-bit adders (n=m×k) using an architecture similar to what is shown in FIG. 4B. In this design, there will be some overheads regarding the mask and repeat bands. However, since a k-bit adder is less complex than an n-bit adder (k<n), and path balancing overhead is removed (relaxed) in DCM, there is a potential for decreasing the total node count. In the following, we extract the exact node count for this new design.

For an n-bit adder, there are 2n+1 inputs, out of which, 2k+1 will be used in the first block (corresponding to the first k-bit adder), generating k+1 outputs. k of these outputs are the final sum bits, whereas one of these outputs is the carry-out of the first k-bit adder block, which is used as the carry-in to the second k-bit adder block. The remaining inputs, 2(n–k), need to go to next blocks as feedforward wires. In total, there will be 2(n–k)+k+1=2n–k+1 wires going from the first stage of pipeline to the second stage. In the second adder block, 2k of the remaining primary inputs will be consumed and again k+1 new outputs will be generated. In total, 2(n–2k)+2k+1=2n–2k+1 wires will go from the second stage of pipeline to the third stage. Similarly, there will be 2(n–pk)+pk+1=2n–pk+1 wires going from the $p^{th}$ adder block to the $(p+1)^{st}$ adder block, where p<m.

Inputs that are used in the $p^{th}$ stage need to go through NDROs in the repeat band preceding this stage. For primary inputs that are not used in the $p^{th}$ block, DRO DFFs in all of the preceding repeat bands are sufficient and they do not need a garbage collection AND gate in the mask band of this block either. Final outputs (sum bits) which are generated at the $p^{th}$ block need garbage collection AND gates only in the mask band following the $p^{th}$ block. In the next mask bands, these final outputs only need DRO DFFs, and they do not need any NDROs in the next repeat bands.

Based on the above explanations, for creating an n-bit adder using m smaller k-bit adders, m(k+1) AND gates, and m(2k+1) NDRO DFFs are required. Regarding DRO DFFs count, m(2n)−2k(1+2+3+ . . . +m)=2mn−km(m+1) are needed in the repeat bands for feedforward wires of type primary input. Also, $$0 + 2k + 3k + \ldots + (m-1)k = m(m-1)\frac{k}{2}$$

DRO DFFs are needed for feedforward wires of type primary output generated in the blocks preceding the last block. Therefore, in total, $$2mn - m(m+3)\frac{k}{2}$$

DRO DFFs are needed.

Each of these NDRO DFFs and AND gates receive a fast and a slow clock, while each DRO DFF only receives a slow clock. To deliver clock signals to z gates, we need to use z−1 clock splitters. Thus, total number of splitters needed to deliver slow clock signals to gates in the repeat and mask bands is $$m(k+1) + m(2k+1) + 2mn - m(m+3)\frac{k}{2} - 1 =$$

$$2mn + 2m + \frac{3}{2}mk - \frac{m^2}{2}k - 1.$$

Moreover, m(k+1)+m(2k+1)−1=3mk+2m−1 splitters are required for the delivery of fast clock to these gates. Therefore, the total number of gates, DFFs, and splitters used in the mask and repeat bands is:

$$4mn+(6m-m^2)k+6m-2 \qquad (2)$$

Example 2: For n=16, k=4, and m=4, the overhead of repeat and mask bands is as follows: AND gates count: 4×5=20, NDRO DFFs count: 4×9=36, DRO DFFs count: 2×4×16−4×7×2=72, total node count including splitters: 4×4×16+(6×4−4²)×4+6×4−2=310.

Example 3: For n=32, k=16, and m=2, the total number of gates, DFFs, and splitters used in the mask and repeat bands is: 394. Using the library of gates in [23], FPB method uses 2,534 and 1,005 nodes for the 32-bit and 16-bit KSAs, respectively. If no path balancing DFF is used, the total gate count for the 16-bit adder will be 565. Therefore, if we use the above method for creating a 32-bit adder using two 16-bit adders, the total node count will be: 394+2×565=1, 524, which shows a (2534−1524)/2534*100=40% reduction in the total node count compared to the standard FPB method.

Figure 10:
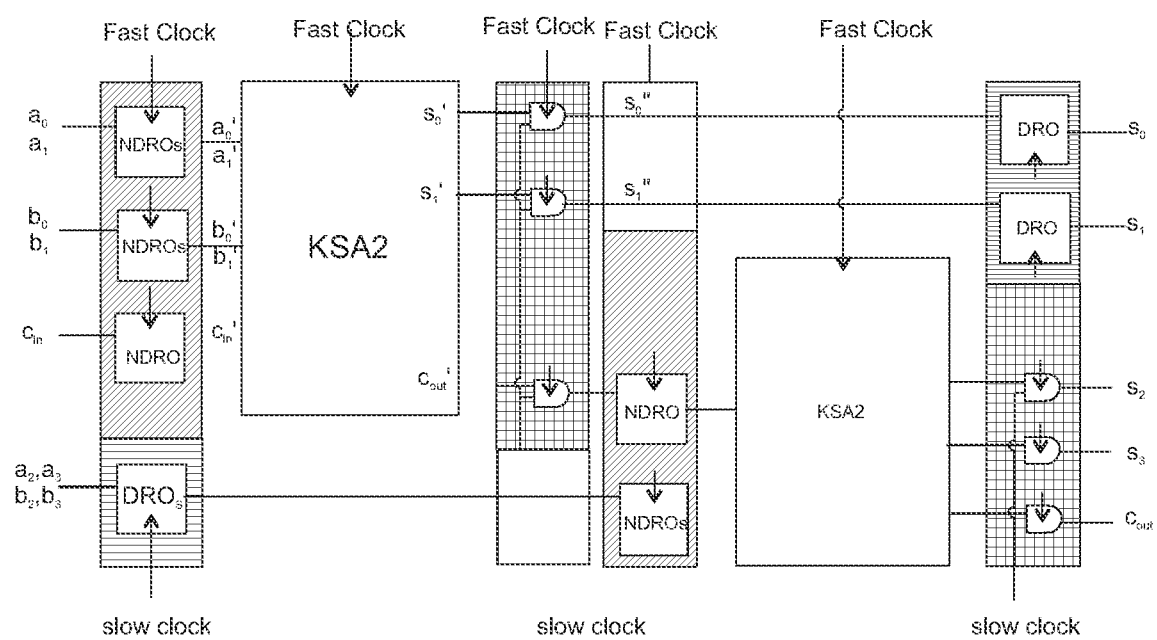
FIG. 10: Design of a 4-bit KSA by using two 2-bit KSAs and following the presented DCM and architecture shown in FIG. 4B.

Example 4: For n=4, k=2, and m=2. FPB method and NPB-based DCM consume 145 and 130 nodes for generating a 4-bit KSA. A detailed design of the circuit generated by DCM for this example is shown in FIG. 10.

2.5.2 Latency, Logical Depth, and Throughput

Suppose that the latency, logical depth, and throughput of a k-bit adder generated by FPB method are $L_k$, $D_k$, and $T_k$, respectively. Latency of the n-bit adder presented in this subsection will be more than the latency of the standard FPB method and its throughput will be less. More accurately, if the latency, logical depth, and throughput of the n-bit adder designed based on the DCM are denoted by $L'_n$, $D'_n$, and $T'_n$, respectively, we will have:

$$L'_n = m \times (L_k + \tau_{AND2} + \tau_{NDRO}) \qquad (3)$$

$$D'_n = m \times (D_k + 2) \qquad (4)$$

$$T'_n = \frac{T_k}{\lambda + 1} \qquad (5)$$

where $\tau_{AND2}$ and $\tau_{NDRO}$ are intrinsic delays of an AND2 and NDRO DFF gates, respectively.

Example 5: Using gates in [23], latency, logical depth and throughput for KSA32 and KSA16 generated by FPB method are: $L_{32}$=93.4 ps, $D_{32}$=12, $T_{32}$=27.5 GHz, and $L_{16}$=76.9 ps, $D_{16}$=10, $T_{16}$=35.7 GHz. For the 32-bit adder in Example 3, we will have: $L'_{32}$=182.2 ps, $D'_{32}$=24, $T'_{32}$=3.25 GHz. This throughput is 7.46× lower than the throughput of a 32-bit adder generated by FPB method. The PPB-based DCM decreases this throughput gap. For example, given λ=3, throughput will be 8.93 GHz, which is 2.07× less than that of the 32-bit adder generated by the FPB method. The total node count in the PPB-based DCM will be 1,876 for λ=3, which shows 25% increase compared to NPB-based DCM.

Simulation and Experimental Results

Figure 11:
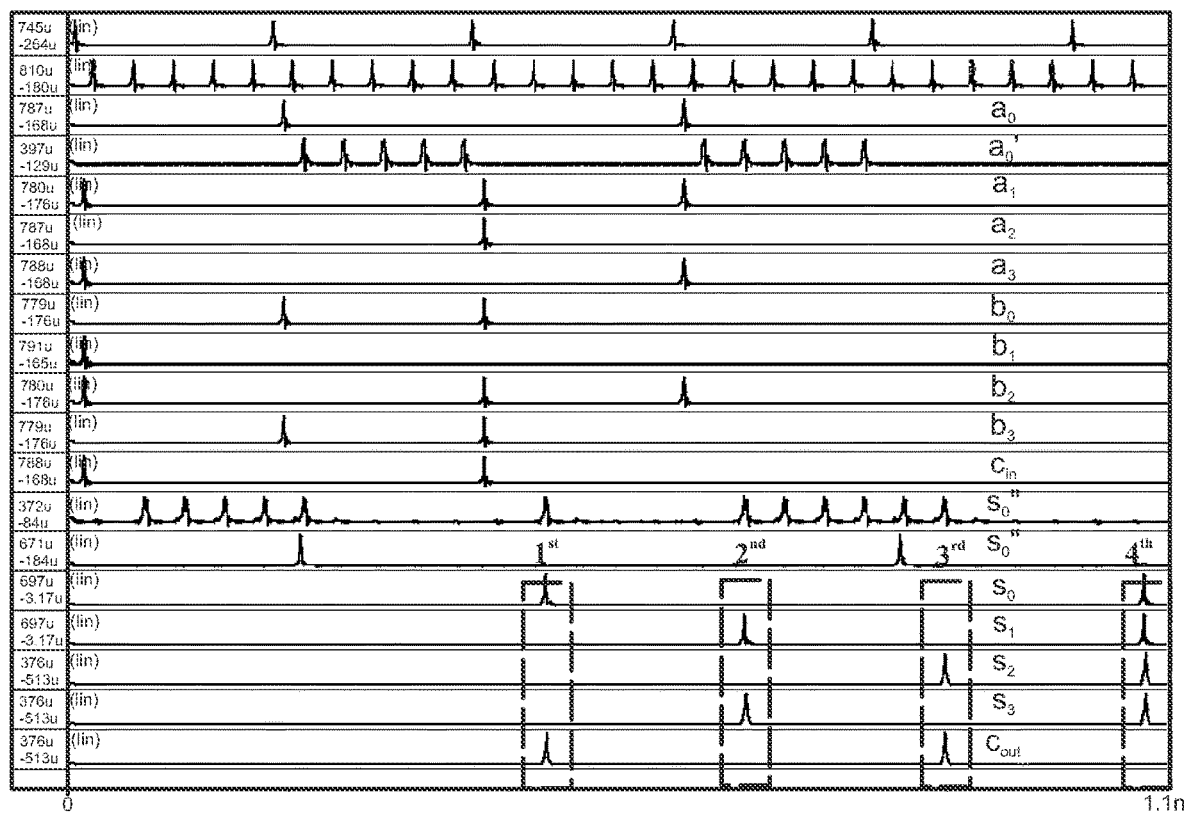
FIG. 11: Simulation results for a 4-bit KSA (KSA4) generated by our dual clocking method (FIG. 10). Inputs, outputs and clock pulses are shown. Four sets of random inputs are applied to this circuit: $a_0=0101$, $a_1=1011$, $a_2=0010$, $a_3=1001$, $b_0=0110$, $b_1=1000$, $b_2=1011$, $b_3=0110$, and $c_{in}=1010$. The correct outputs are $S_0=1001$, $S_1=0101$, $S_2=0011$, $S_3=0101$, and $C_{out}=1010$ are generated.

To verify the correct operation of circuits generated by our proposed method, we simulated a KSA4 circuit using the Josephson simulator (JSIM) [24]. The architecture of this circuit is shown in FIG. 10. FIG. 11 shows waveforms for inputs, outputs, and signals for some internal nodes. The value of λ in this design is four, hence, the frequency of the slow clock is ⅕ of the fast clock. Four random values for inputs are used: $a_0$=0101, $a_1$=1011, $a_2$=0010, $a_3$=1001, $b_0$=0110, $b_1$=1000, $b_2$=1011, $b_3$=0110, and $c_{in}$=1010. For each of these inputs, correct values for outputs as follows are observed which can be seen in FIG. 11: $S_0$=1001, $S_1$=0101, $S_2$=0011, $S_3$=0101, and $C_{out}$=1010.

Embedded NDROs in the repeat bands repeat each set of these inputs by four times (for a total of five presentations of the same data values). For example, after $a_0$ passes the corresponding NDRO, $a'_0$ is generated, with the waveform shown in FIG. 11. After passing outputs of NDROs connected to inputs $a_0$, $a_1$, $b_0$, and $b_1$ to the first KSA2 block, pulses for $S'_0$, $S'_1$, and $C'_{out}$ which are outputs of this KSA2, are generated. $S'_0$ is shown in FIG. 11 as an example. These pulses will be filtered in the following mask band and at the fifth cycle of the fast clock, the correct values of these signals will be captured and given to the next stage (look at waveform of $S''_0$). $S''_0$ and $S''_1$ do not need to have any NDROs in the second repeat band nor any AND gate in the last mask band. As shown in FIG. 10, for timing synchronization of these signal, DRO DFFs are used in the last mask band.

Different design metrics including total Josephson junction count (#JJs), total area, DRO and NDRO DFF counts, and total node count including gates, DFFs and splitters are extracted for 15 benchmark circuits. These circuits are in ISCAS [22] and EPFL [25] benchmark suites, or they are some arithmetic circuits. The arithmetic circuits are: KSA32, KSA4, an 8-bit array multiplier (Mult8), and an 8-bit integer divider (IntDiv8). The SFQ cell library that we used [23] contains the following gates: and2 with 12 JJs, or2 with 8 JJs, xor2 with 8 JJs, not with 9 JJs, DRO DFF with 7 JJs, NDRO DFFs with 11 JJs, splitter with 3 JJs, and JTL with 2 JJs.

Figure 12:
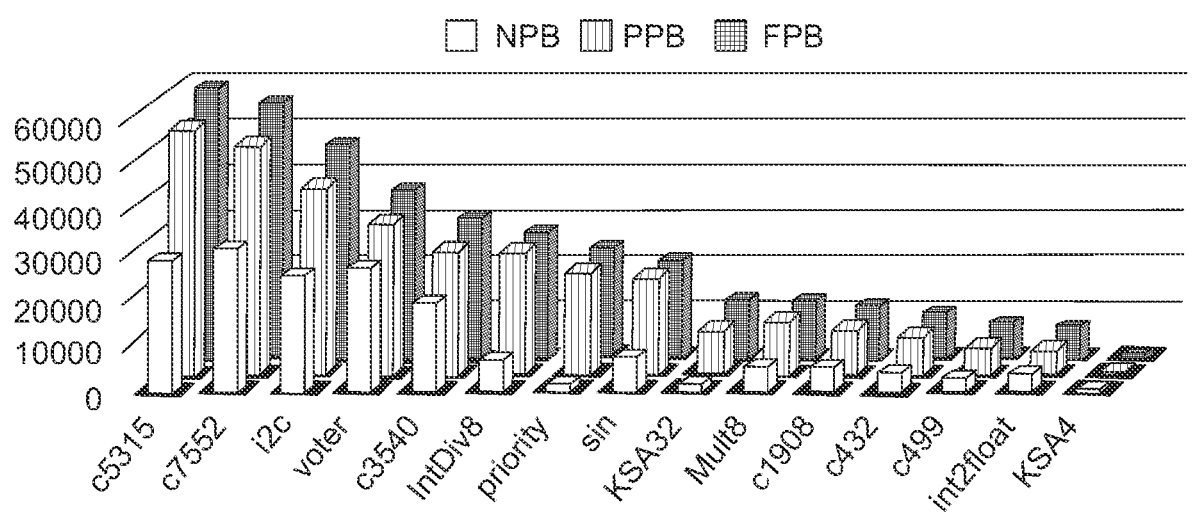
FIG. 12: Total Josephson junction count for different benchmark circuits. For better exhibition purposes, data for voter, priority, and sin benchmark circuits is scaled down by a factor of 10.
Figure 13:
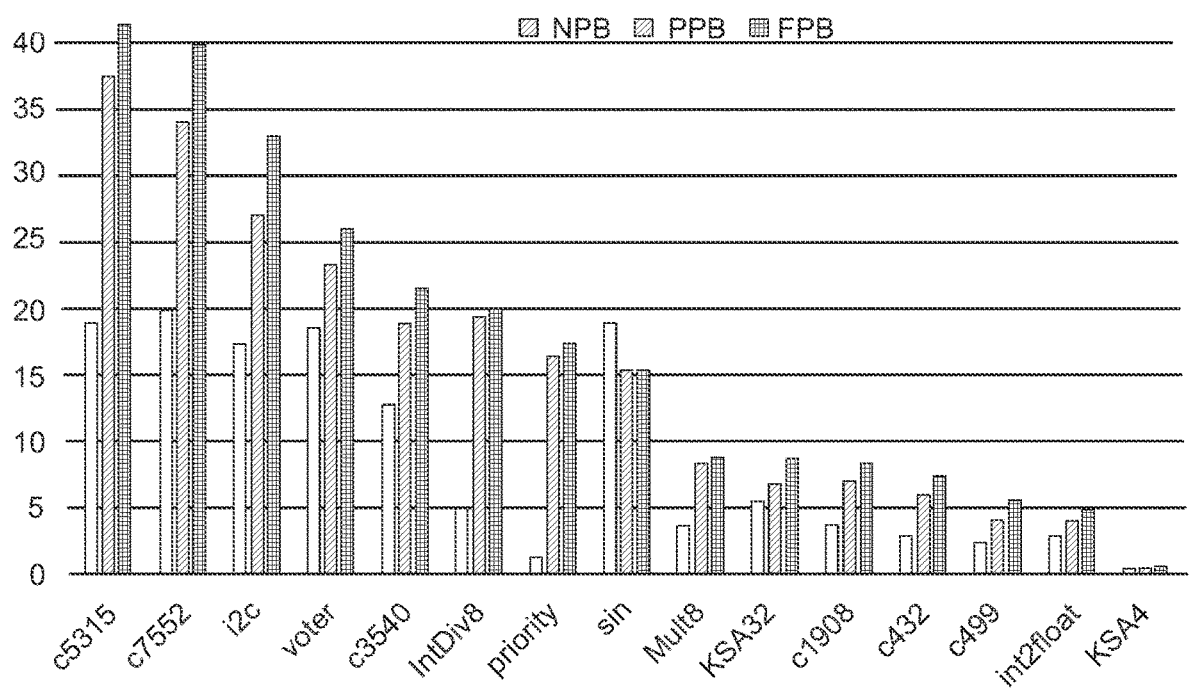
FIG. 13: Total area in $mm^2$ for different benchmark circuits. For better exhibition purposes, data for voter, priority, and sin benchmark circuits is scaled down by a factor of 10.
Figure 14:
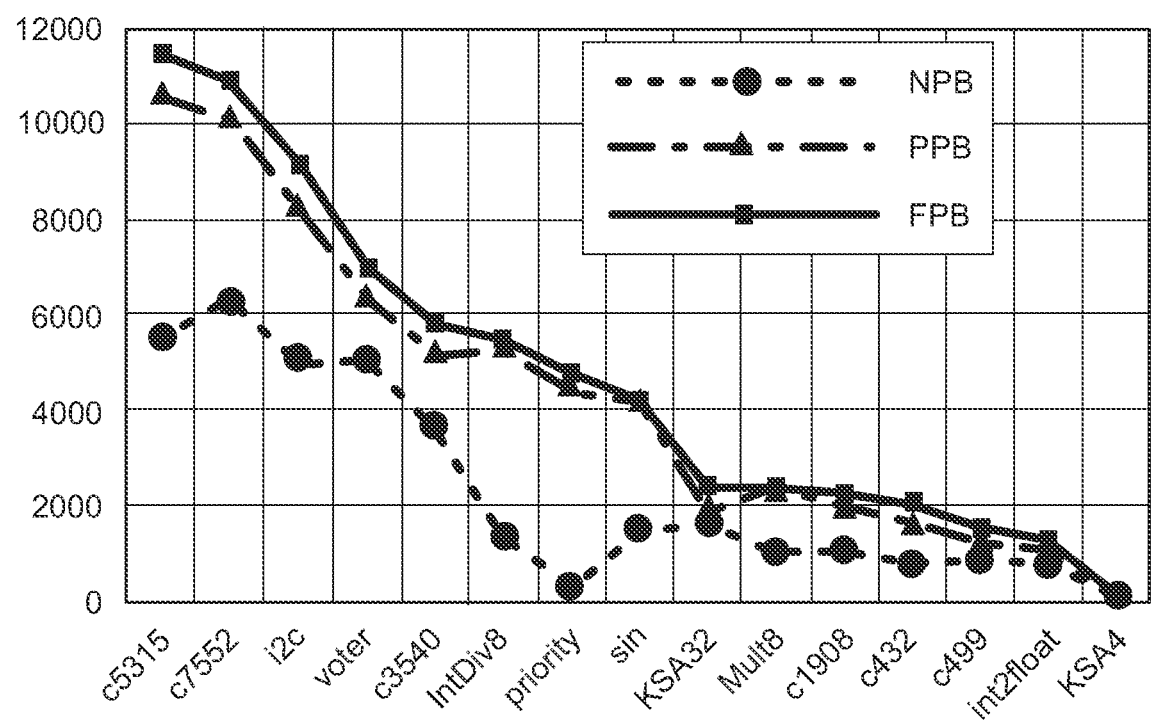
FIG. 14: Total node count including: gates, DFFs, and splitter for different benchmark circuits. For better exhibition purposes, data for voter, priority, and sin benchmark circuits is scaled down by a factor of 10.

Table I, and FIGS. 12, 13, 14 show the experimental results for the aforementioned circuits. In these results, it is assumed that there is only one block in the NPB- and PPB-based DCM. Therefore, the latency of circuits generated by NPB- and PPB-based DCM will be more than the latency of counterpart circuits generated by FPB method by an amount equal to sum of delay of an AND2 gate and delay of an NDRO DFF. The results for PPB are extracted for $\lambda=4$. Therefore, the throughput for circuits generated by PPB is ⅕ of the FPB method. Throughput of circuits generated by NPB-based DCM is 1/d' of the throughput of the same circuit generated by FPB, where d' is depth of the circuit. The cut-based technology mapping algorithm (command map) of ABC [26] is used in all three methods. Having only one original block, NDRO DFF count for circuits generated by FPB method, and DRO DFF count for circuits generated by NPB method are 0, hence, the corresponding fields are removed from Table I.

The first design is what is presented in Example 5 which is using two KSA16 based on PPB DCM. Let's call this adder, Adder1. The second design is an adder created using PPB-based DCM using a single block of KSA32 having the same value for $\lambda$ as in Adder1. Let's call this design, Adder2. Adder1 requires 1876 total nodes with latency of 182.2 ps given $\lambda=3$. Adder2 requires 2171 total nodes and its latency is 107.6 ps. Throughput for both adders will be the same. Therefore, if fewer node count is more important in a design, Adder1 is a better choice, while if the latency has a higher priority, Adder2 will be a better option.

CONCLUSION

In the present invention, two dual clocking methods for realization of Single Flux Quantum (SFQ) circuits based on No Path Balancing (NPB) and Partially Path Balancing (PPB) methods are presented. In these methods, a micro clock is used as input clock signal for gates in original blocks of the given circuit, and a macro clock is used for sampling the correct output values of these blocks. Some NDRO DFFs are employed to repeat inputs of each original block and some AND garbage collection gates are used to sample valid outputs of a block. The proposed method helps reducing total Josephson junction count, total area, and total

TABLE I

Experimental results for FPB, PPB, and NPB. #PI, #PO, and #DFFs stand for PI count, PO count, DFF count, respectively. DFF count is split into NDROs and DROs.

| circuits | #PI | #PO | Depth | #DFFs(NDRO) PPB | NPB | #DFFs(DRO) FPB | PPB |
|---|---|---|---|---|---|---|---|
| c1908 | 33 | 25 | 20 | 33 | 33 | 683 | 473 |
| c432 | 36 | 7 | 24 | 36 | 36 | 655 | 447 |
| c499 | 41 | 32 | 13 | 41 | 41 | 442 | 218 |
| c7552 | 207 | 108 | 21 | 207 | 207 | 2790 | 1912 |
| c3540 | 50 | 22 | 32 | 50 | 50 | 1220 | 795 |
| c5315 | 178 | 123 | 27 | 178 | 178 | 3421 | 2554 |
| i2c | 147 | 142 | 17 | 147 | 147 | 2461 | 1544 |
| int2float | 11 | 7 | 16 | 11 | 11 | 277 | 139 |
| priority | 128 | 8 | 249 | 128 | 128 | 22480 | 21115 |
| sin | 24 | 25 | 186 | 24 | 24 | 13717 | 13581 |
| voter | 1001 | 1 | 71 | 1001 | 1001 | 11144 | 6716 |
| KSA32 | 65 | 33 | 12 | 65 | 65 | 532 | 167 |
| KSA4 | 9 | 5 | 6 | 9 | 9 | 25 | 0 |
| Mult8 | 16 | 16 | 40 | 16 | 16 | 734 | 655 |
| IntDiv8 | 16 | 16 | 86 | 16 | 16 | 2098 | 1995 |

On average for 15 benchmark circuits, NPB-based DCM reduces #JJs, #Nodes, and area by 2.23×, 1.85×, and 2.0×, respectively compared with FPB method. The amount of improvements for those circuits with higher ratio of DFF count to gate count is more. For example, NPB-based DCM has 14.0× less area for priority circuit, and 2.93× fewer total node count for IntDiv8 compared with FPB method. This is because, these circuits need a huge number of path balancing DFFs in the standard FPB method. This is the reason behind seeing a local minimum for priority circuit in the curve of NPB shown in FIG. 14. The average improvements on #JJs, #Nodes, and area that PPB-based DCM provides is 12.06%, 9.62%, and 15.38%, respectively compared to FPB. Also, PPB-based DCM does not require any path balancing DFFs for KSA4, and it reduces the total DRO DFF count by an average of 46.34% compared to FPB method for other 14 benchmarks.

The last thing that we want to compare in this section is experimental results of two different designs for KSA32.

node count of SFQ circuits by orders of magnitudes compared to the standard fully path balancing method. Our approach increases the similarity between realization of SFQ circuits and CMOS circuits at the gate level, RTL, and higher abstraction levels, hence, it opens doors for employing well-matured techniques developed for CMOS circuits in their SFQ counterparts.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

REFERENCES

[1] G. E. Moore, "Cramming more components onto integrated circuits," *Electronics*, vol. 38, no. 8, pp. 114-117, 1965.

[2] H. Esmaeilzadeh, E. Blem, R. S. Amant, K. Sankaralingam, and D. Burger, "Dark silicon and the end of multicore scaling," in *Computer Architecture (ISCA), 2011 38th Annual International Symposium on*. 1 em plus 0.5 em minus 0.4 em IEEE, 2011, pp. 365-376.

[3] M. H. Volkmann, A. Sahu, C. J. Fourie, and O. A. Mukhanov, "Experimental investigation of energy-efficient digital circuits based on esfq logic," *IEEE Trans. Appl. Supercond*, vol. 23, no. 3, p. 1301505, 2013.

[4] N. Takeuchi, D. Ozawa, Y. Yamanashi, and N. Yoshikawa, "An adiabatic quantum flux parametron as an ultra-low-power logic device," *Superconductor Science and Technology*, vol. 26, no. 3, p. 035010, 2013.

[5] Q. P. Herr, A. Y. Herr, O. T. Oberg, and A. G. Ioannidis, "Ultra-low-power superconductor logic," *Journal of applied physics*, vol. 109, no. 10, p. 103903, 2011.

[6] K. Likharev and V. Semenov, "Rsfq logic/memory family: A new josephson-junction technology for sub-terahertz-clock-frequency digital systems," *IEEE Transactions on Applied Superconductivity*, vol. 50, no. 1, 1991.

[7] D. Kirichenko, S. Sarwana, and A. Kirichenko, "Zero static power dissipation biasing of rsfq circuits," *IEEE Transactions on Applied Superconductivity*, vol. 21, no. 3, p. 776, 2011.

[8] K. Likharev, O. Mukhanov, and V. Semenov, "Resistive single flux quantum logic for the josephson-junction digital technology," in *SQUID '85*. 1 em plus 0.5 em minus 0.4 em Walter de Gruyter, Berlin, 1985, pp. 1103-1108.

[9] V. Koshelets, K. Likharev, V. Migulin, O. Mukhanov, G. Ovsyannikov, V. Semenov, I. Serpuchenko, and A. Vystavkin, "Experimental realization of a resistive single flux quantum logic circuit," *IEEE Transactions on Magnetics*, vol. 23, no. 2, pp. 755-758, 1987.

[10] W. Chen, A. Rylyakov, V. Patel, J. Lukens, and K. Likharev, "Rapid single flux quantum t-flip flop operating up to 770 ghz," *IEEE Transactions on Applied Superconductivity*, vol. 9, no. 2, pp. 3212-3215, 1999.

[11] T. V. Filippov, A. Sahu, A. F. Kirichenko, I. V. Vernik, M. Dorojevets, C. L. Ayala, and O. A. Mukhanov, "20 ghz operation of an asynchronous wave-pipelined rsfq arithmetic-logic unit," *Physics Procedia*, vol. 36, pp. 59-65, 2012.

[12] M. Dorojevets, C. L. Ayala, N. Yoshikawa, and A. Fujimaki, "16-bit wave-pipelined sparse-tree rsfq adder," *IEEE Transactions on Applied Superconductivity*, vol. 23, no. 3, pp. 1 700 605-1 700 605, 2013.

[13] A. F. Kirichenko, I. V. Vernik, J. A. Vivalda, R. T. Hunt, and D. T. Yohannes, "Ersfq 8-bit parallel adders as a process benchmark," *IEEE Trans. Appl. Supercond*, vol. 25, no. 3, p. 1, 2015.

[14] K. Gaj, Q. P. Herr, V. Adler, A. Krasniewski, E. G. Friedman, and M. J. Feldman, "Tools for the computer-aided design of multigigahertz superconducting digital circuits," *IEEE transactions on applied superconductivity*, vol. 9, no. 1, pp. 18-38, 1999.

[15] C. J. Fourie, "Digital superconducting electronics design toolâ€" status and roadmap," *IEEE Transactions on Applied Superconductivity*, vol. 28, no. 5, pp. 1-12, 2018.

[16] G. Pasandi and M. Pedram, "PBMap: A path balancing technology mapping algorithm for single flux quantum logic circuits," *IEEE Transactions on Applied Superconductivity*, vol. 29, no. 4, pp. 1-14, 2019.

[17] G. Pasandi, A. Shafaei, and M. Pedram, "SFQmap: A technology mapping tool for single flux quantum logic circuits," in *International Symposium on Circuits and Systems (ISCAS)*. 1 em plus 0.5 em minus 0.4 em IEEE, May 27, 2018.

[18] R. N. Tadros and P. A. Beerel, "A robust and tree-free hybrid clocking technique for rsfq circuits—csr application," in *16th International Superconductive Electronics Conference, Sorento, Italy*, June 2017.

[19] S. N. Shahsavani, B. Zhang, and M. Pedram, "Accurate margin calculation for single flux quantum logic cells," 2018.

[20] S. N. Shahsavani, A. Shafaei, and M. Pedram, "A placement algorithm for superconducting logic circuits based on cell grouping and super-cell placement," in *Design, Automation & Test in Europe Conference & Exhibition (DATE)*, 2018. 1 em plus 0.5 em minus 0.4 em IEEE, 2018, pp. 1465-1468.

[21] N. K. Katam and M. Pedram, "Logic optimization, complex cell design and retiming of single flux quantum circuits," *IEEE Transactions on Applied Superconductivity*, 2018.

[22] M. C. Hansen, H. Yalcin, and J. P. Hayes, "Unveiling the iscas-85 benchmarks: A case study in reverse engineering," *IEEE Design & Test of Computers*, vol. 16, no. 3, pp. 72-80, 1999.

[23] C. Fourie. (2018) Rsfq cell library. [Online]. Available: https://github.com/sunmagnetics/RSFQlib=0pt

[24] JSIM. (2017) The berkeley superconducting spice simulator. [Online]. Available: https://github.com/cold-logix/jsim=0pt

[25] EPFL. (2017) The epfl combinational benchmark suite. [Online]. Available: https://lsi.epfl.ch/benchmarks=0pt

[26] B. L. SYNTHESIS, "ABC: A system for sequential synthesis and verification," *Berkeley Logic Synthesis and Verification Group*, 2018.

What is claimed is:

1. A single flux quantum ("SFQ") circuit system comprising:
at least one SFQ block that includes a plurality of SFQ logic gates, at least a portion of the SFQ logic gates arranged in series; and
a timing system configured to provide a first set of inputs and collect a first set of outputs of the at least one SFQ block at a first rate defined by a slow clock frequency while the SFQ logic gates are clocked at a second rate defined by a fast clock frequency wherein the first rate is sufficiently slower than the second rate to enable the first set of inputs to be presented one or more times to the at least one SFQ block at the second rate and the first set of inputs to propagate through all levels of the SFQ logic gates to produce the first set of outputs of the at least one SFQ block without colliding with a second set of inputs to the at least one SFQ block.

2. The SFQ circuit system of claim 1 wherein the ratio of the second rate to the first rate is lower bounded by the maximum difference of path lengths from primary inputs of the at least one SFQ block to input pins of any SFQ logic gate in the at least one SFQ block.

3. The SFQ circuit system of claim 1 wherein the ratio of the second rate to the first rate is equal to either $\lambda+1$ or $\lambda+2$ where $\lambda$ denotes the maximum difference of path lengths from primary inputs of the at least one SFQ block to input pins of any SFQ logic gate in the at least one SFQ block.

4. The SFQ circuit system of claim 1 wherein if the at least one SFQ block has a logic depth D, then inputs to this SFQ block are presented at most D+1 times at a fast clock frequency rate in order to guarantee generation of valid values at all of its outputs at a slow clock frequency rate.

5. The SFQ circuit system of claim 4 wherein the slow clock frequency is at least 1/(D+2) of that of the fast clock frequency.

6. The SFQ circuit system of claim 5 wherein when there are two or more SFQ blocks in the SFQ circuit system, D is the maximum of logic depths of these SFQ block.

7. The SFQ circuit system of claim 1 further comprising feedforward wires with no clocked elements connected thereto.

8. The SFQ circuit system of claim 7 wherein the feedforward wires are primary inputs or inputs from a previous SFQ block.

9. The SFQ circuit system of claim 1 wherein the timing system includes:
   a dual clock repeat band that performs input signal repetition, the dual clock repeat band comprising a plurality of SFQ non-destructive read-out (NDRO) registers, each SFQ NDRO register receiving an input signal to its "set" pin, a fast clock signal having fast clock frequency on its "clk" pin, and a slow clock signal having the slow clock frequency on its "reset" pin; and
   a dual clock mask band that performs valid output collection, the dual clock mask band including a plurality of 2-input SFQ AND gates which operate at the fast clock frequency, each 2-input SFQ AND gate having a signal from a slow clock as a first input and an output signal from a preceding gate as a second input, wherein each SFQ block operates with the fast clock frequency and is preceded by a corresponding dual clock repeat band and succeeded by a corresponding dual clock mask band.

10. The SFQ circuit system of claim 9 wherein when an $i^{th}$ SFQ block has a feedforward wire that connects an output of a given SFQ block i−1 to an input of SFQ block i+1, the dual clock repeat band of the $i^{th}$ SFQ block has a corresponding destructive read-out (DRO) register operating at the slow clock frequency and receiving input signals on its data pin, and the dual clock mask band of the $i^{th}$ SFQ block is simply a wire connection.

11. The SFQ circuit system of claim 9 wherein when a $j^{th}$ SFQ block has a feedforward wire from a primary input or an input from a previous SFQ block, the $j^{th}$ SFQ block has a NDRO register in its repeat band.

12. The SFQ circuit system of claim 9 wherein when an output y of a SFQ block j is fed forward directly as a primary output of another circuit, destructive read-out (DRO) registers are inserted in mask bands of SFQ blocks j+1, ..., N where N is the number of SFQ blocks.

13. The SFQ circuit system of claim 1 including SFQ blocks that are fully path balanced.

14. The SFQ circuit system of claim 1 including partially path balanced SFQ blocks.

15. The SFQ circuit system of claim 14 wherein the partially path balanced SFQ blocks include path balancing DFFs.

16. The SFQ circuit system of claim 1 further comprising a SFQ clock generator circuit that generates a first clock signal and a second clock signal, each signal comprising a regular stream of SFQ clock pulses, where the first clock signal is at a fast clock signal operating at the fast clock frequency and the second clock signal is a slow clock signal operating at the slow clock frequency, the fast clock frequency being larger than the slow clock frequency.

17. The SFQ circuit system of claim 16 wherein pulse from the fast clock signal and the slow clock signal comply with a time requirements as follows:
   1. $\Delta t_1 \geq$ the intrinsic reset delay of an NDRO.
   2. $\Delta t_2 \geq$ the setup time of an NDRO.
   3. $\Delta t_1 + \Delta t_2 \leq T_{FastClock}$.
   4. $T_{FastClock} = T_{SlowClock}/(\lambda+1)$.
wherein:
$\lambda$ is the maximum of imbalance factors for any SFQ blocks of the SFQ circuit system where the imbalance factor of a SFQ block is the maximum difference of path lengths from inputs of the block to input pins of any SFQ logic gate in the block;
$T_{FastClock}$ is the time period for the fast clock;
$T_{SlowClock}$ is the time period for the slow clock;
$\Delta t_1$ is the time offset from the slow clock to the input; and
$\Delta t_2$ is the time offset from the inputs to the fast clock.

18. The SFQ circuit system of claim 17 where $\lambda$ is chosen to be smaller than the maximum of logic depths of all SFQ blocks.

19. A single flux quantum ("SFQ") circuit system comprising:
   at least one SFQ block that includes a plurality of SFQ logic gates, at least a portion of the SFQ logic gates arranged in series; and
   an SFQ clock generator circuit, generating a first clock signal and a second clock signal, each signal comprising a regular stream of SFQ clock pulses, where the first clock signal is a fast clock signal operating at a fast clock frequency and the second clock signal is a slow clock signal operating at a slow clock frequency, the fast clock frequency being larger than the slow clock frequency, wherein inputs to and outputs of the at least one SFQ block are provided at a first rate defined by the slow clock frequency while the SFQ logic gates in the at least one SFQ block being clocked at a second rate defined by the fast clock frequency.

20. The SFQ circuit system of claim 19 wherein the ratio of the fast clock frequency to the slow clock frequency is lower bounded by the maximum difference of path lengths from primary inputs of the at least one SFQ block to input pins of any SFQ logic gate in the at least one SFQ block.

21. The SFQ circuit system of claim 19 wherein the ratio of the second rate to the first rate is equal to either $\lambda+1$ or $\lambda+2$ where $\lambda$ denotes the maximum difference of path lengths from primary inputs of the at least one SFQ block to input pins of any SFQ logic gate in the at least one SFQ block.

22. The SFQ circuit system of claim 21 further comprising feedforward wires with no clocked elements connected thereto.

23. The SFQ circuit system of claim 22 wherein the feedforward wires are primary inputs or inputs from a previous SFQ block.

24. The SFQ circuit system of claim 19 further comprising a timing system that includes:
   a dual clock repeat band that performs input signal repetition, the dual clock repeat band comprising a plurality of SFQ non-destructive read-out (NDRO) registers, each SFQ NDRO register receiving an input signal to its "set" pin, the fast clock signal on its "clk" pin, and the slow clock signal on its "reset" pin; and a dual clock mask band that performs valid output collection, the dual clock mask band including a plurality of 2-input SFQ AND gates which operate at the fast clock frequency, each 2-input SFQ AND gate having a signal from a slow clock as a first input and an output signal from a preceding gate as a second input, wherein each SFQ block operates with the fast clock frequency and is preceded by a corresponding dual clock repeat band and succeeded by a corresponding dual clock mask band.

25. The SFQ circuit system of claim 24 wherein when an $i^{th}$ SFQ block has a feedforward wire that connects an output of a given SFQ block i−1 to an input of SFQ block i+1, the dual clock repeat band of the $i^{th}$ SFQ block has a corresponding destructive read-out (DRO) register operating at the slow clock frequency and receiving input signals on its data pin, and the dual clock mask band of the $i^{th}$ SFQ block is simply a wire connection.

26. The SFQ circuit system of claim 24 wherein when a $j^{th}$ SFQ block has a feedforward wire from a primary input or an input from a previous SFQ block, the $j^{th}$ SFQ block has a NDRO register in its repeat band.

27. The SFQ circuit system of claim 24 wherein when an output y of a SFQ block j is fed forward directly as a primary output of another circuit, destructive read-out (DRO) registers are inserted in mask bands of SFQ blocks j+1, . . . , N where N is the number of SFQ blocks.

28. The SFQ circuit system of claim 19 including SFQ blocks that are fully path balanced.

29. The SFQ circuit system of claim 19 including partially path balanced SFQ blocks.

30. The SFQ circuit system of claim 29 wherein the partially path balanced SFQ blocks include path balancing DFFs.

31. A single flux quantum ("SFQ") circuit system comprising:
   at least one SFQ block that includes a plurality of SFQ logic gates, at least a portion of the SFQ logic gates arranged in series; and
   a timing system configured to provide a first set of inputs and collect a first set of outputs of the at least one SFQ block at a rate defined by a slow clock frequency while the SFQ logic gates are clocked at a fast clock frequency wherein the said rate is sufficiently slow to allow the first set of inputs to propagate through all levels of the SFQ logic gates to produce the first set of outputs of the at least one SFQ block without colliding with a second set of inputs to the at least one SFQ block.

* * * * *